US012297385B2

(12) United States Patent
Cho et al.

(10) Patent No.: US 12,297,385 B2
(45) Date of Patent: May 13, 2025

(54) ETCHING COMPOSITIONS AND METHODS FOR FABRICATING SEMICONDUCTOR DEVICES BY USING THE SAME

(71) Applicants: Samsung Electronics Co., Ltd., Suwon-si (KR); DONGWOO FINE-CHEM CO., LTD., Iksan-si (KR)

(72) Inventors: Min Hyung Cho, Suwon-si (KR); Hyo Joong Yoon, Iksan-si (KR); Min Ju Im, Iksan-si (KR); Jung Min Oh, Incheon (KR); Sang Won Bae, Suwon-si (KR); Hyo San Lee, Hwaseong-si (KR)

(73) Assignees: SAMSUNG ELECTRONICS CO., LTD., Suwon-si (KR); DONGWOO FINE-CHEM CO., LTD., Iksan-si (KR)

( * ) Notice: Subject to any disclaimer, the term of this patent is extended or adjusted under 35 U.S.C. 154(b) by 148 days.

(21) Appl. No.: 17/573,734

(22) Filed: Jan. 12, 2022

(65) Prior Publication Data

US 2022/0267673 A1    Aug. 25, 2022

(30) Foreign Application Priority Data

Feb. 22, 2021 (KR) .................. 10-2021-0023225

(51) Int. Cl.
C09K 13/00 (2006.01)
H01L 21/3213 (2006.01)
H01L 21/768 (2006.01)

(52) U.S. Cl.
CPC ........ *C09K 13/00* (2013.01); *H01L 21/32134* (2013.01); *H01L 21/76805* (2013.01); *H01L 21/76843* (2013.01); *H01L 21/76895* (2013.01)

(58) Field of Classification Search
CPC ................ C11D 11/0047; C09K 13/00; H01L 21/32134; H01L 21/76805; H01L 21/76843; H01L 21/76895; H01L 21/76834; H01L 21/76883; H01L 23/485; H01L 23/5226; H01L 21/823431; H01L 21/823475; C23F 1/28; C23F 1/40; C23F 1/10
USPC ......................................... 510/175
See application file for complete search history.

(56) References Cited

U.S. PATENT DOCUMENTS

| | | | |
|---|---|---|---|
| 9,373,584 B2 | 6/2016 | Boyanov et al. |
| 10,026,564 B2 | 7/2018 | Han et al. |
| 10,062,580 B2 | 8/2018 | Mizutani et al. |
| 10,435,794 B2 | 10/2019 | Muro et al. |
| 2014/0091052 A1 | 4/2014 | Nagashima et al. |

(Continued)

FOREIGN PATENT DOCUMENTS

| | | |
|---|---|---|
| JP | 6256851 B2 | 1/2018 |
| JP | 2020107757 A | 7/2020 |

(Continued)

*Primary Examiner* — Andrew J. Oyer
(74) *Attorney, Agent, or Firm* — Myers Bigel, P.A.

(57) ABSTRACT

Etching compositions are provided. The etching compositions can be used for etching cobalt. The etching compositions may include a chelator, water, an oxidizer, and an organic solvent, and the chelator may include an organic acid, an amine compound and/or a polyhydric alcohol. Water may be present in an amount of 1 wt % to 10 wt % based on a total weight of the etching composition.

9 Claims, 26 Drawing Sheets

(56) References Cited

U.S. PATENT DOCUMENTS

| | | | |
|---|---|---|---|
| 2018/0138053 A1 | 5/2018 | Yao et al. | |
| 2019/0276739 A1* | 9/2019 | Liu | ........................ C09K 13/00 |
| 2019/0284704 A1* | 9/2019 | Ge | .................... H01L 21/32134 |
| 2020/0098626 A1 | 3/2020 | Chowdhury et al. | |
| 2020/0208052 A1 | 7/2020 | Song et al. | |
| 2020/0392405 A1* | 12/2020 | Kneer | .................... C09K 13/00 |

FOREIGN PATENT DOCUMENTS

| | | |
|---|---|---|
| KR | 20180048344 A | 5/2018 |
| KR | 20200073237 A | 6/2020 |
| KR | 20200093059 A | 8/2020 |

\* cited by examiner

ETCHING COMPOSITIONS AND METHODS FOR FABRICATING SEMICONDUCTOR DEVICES BY USING THE SAME

CROSS-REFERENCE TO RELATED APPLICATION

This application claims the benefit of Korean Patent Application No. 10-2021-0023225, filed on Feb. 22, 2021, in the Korean Intellectual Property Office, the disclosure of which is incorporated herein in its entirety by reference.

FIELD

The present disclosure relates to an etching composition and a method for fabricating a semiconductor device using the same.

BACKGROUND

With the rapid supply of information media in recent years, the functions of semiconductor devices have also been dramatically improved. In the case of recent semiconductor products, low cost becomes desirable to secure competitiveness and high integration of products becomes desirable for high quality. The semiconductor devices are being scaled down for high integration.

In a fabricating process of the semiconductor device for scaling down the semiconductor device, there is a problem that a surface of cobalt (Co) is non-uniformly etched while wet-etching the cobalt (Co).

SUMMARY

Aspects of the present disclosure provide etching compositions in which chelator is bound to cobalt (Co) to form a compound having a pentagonal ring structure or a compound of a hexagonal ring structure, thereby forming a stable coordinate bond with cobalt (Co) to reduce or prevent uneven etch of a layer including cobalt (Co), and methods for fabricating a semiconductor device using etching compositions.

According to some embodiments of the present disclosure, there is provided an etching composition. The etching composition is used for etching cobalt (e.g., a layer including cobalt), and the etching composition may include a chelator, water, an oxidizer, and an organic solvent. The chelator may include at least one of an organic acid, an amine compound and a polyhydric alcohol, and the water is present in an amount of 1 wt % to 10 wt % based on a total weight of the etching composition.

According to some embodiments of the present disclosure, there is provided an etching composition. The etching composition is used for etching cobalt, wherein the etching composition may include a chelator, water, an oxidizer, and an organic solvent, the chelator may include at least one of an organic acid, an amine compound and a polyhydric alcohol, and the chelator is configured to bind to cobalt to form a compound having a pentagonal ring structure or a compound of a hexagonal ring structure.

According to some embodiments of the present disclosure, there is provided a method for fabricating a semiconductor device using an etching composition. The method may include forming an active pattern extending in a first horizontal direction on a substrate, forming a dummy gate extending in a second horizontal direction intersecting the first horizontal direction on the active pattern, forming a recess in the active pattern, using a dummy gate as a mask, forming a source/drain region in the recess, removing the dummy gate, forming a gate electrode in a portion from which the dummy gate is removed, forming a first interlayer insulating layer on the gate electrode, forming a contact trench that penetrates the first interlayer insulating layer in a vertical direction, forming a contact barrier layer in the contact trench, forming a contact filling layer containing cobalt on the contact barrier layer to fill the inside of the contact trench, removing a part of the contact filling layer using the etching composition to form a first trench, forming a second interlayer insulating layer in the first trench, and forming a via that penetrates the second interlayer insulating layer in the vertical direction and is connected to the contact filling layer, wherein the etching composition may include a chelator, water, an oxidizer, and an organic solvent, the chelator may include at least one of an organic acid, an amine compound and a polyhydric alcohol, and the chelator is configured to bind to cobalt to form a compound having a pentagonal ring structure or a compound having a hexagonal ring structure.

However, aspects of the present disclosure are not limited to the one set forth herein. The above and other aspects of the present disclosure will become more apparent to one of ordinary skill in the art to which the present disclosure pertains by referencing the detailed description provided herein.

BRIEF DESCRIPTION OF THE DRAWINGS

The above and other aspects and features of the present disclosure will become more apparent by describing in detail example embodiments thereof referring to the attached drawings, in which.

DETAILED DESCRIPTION

Figure 1:
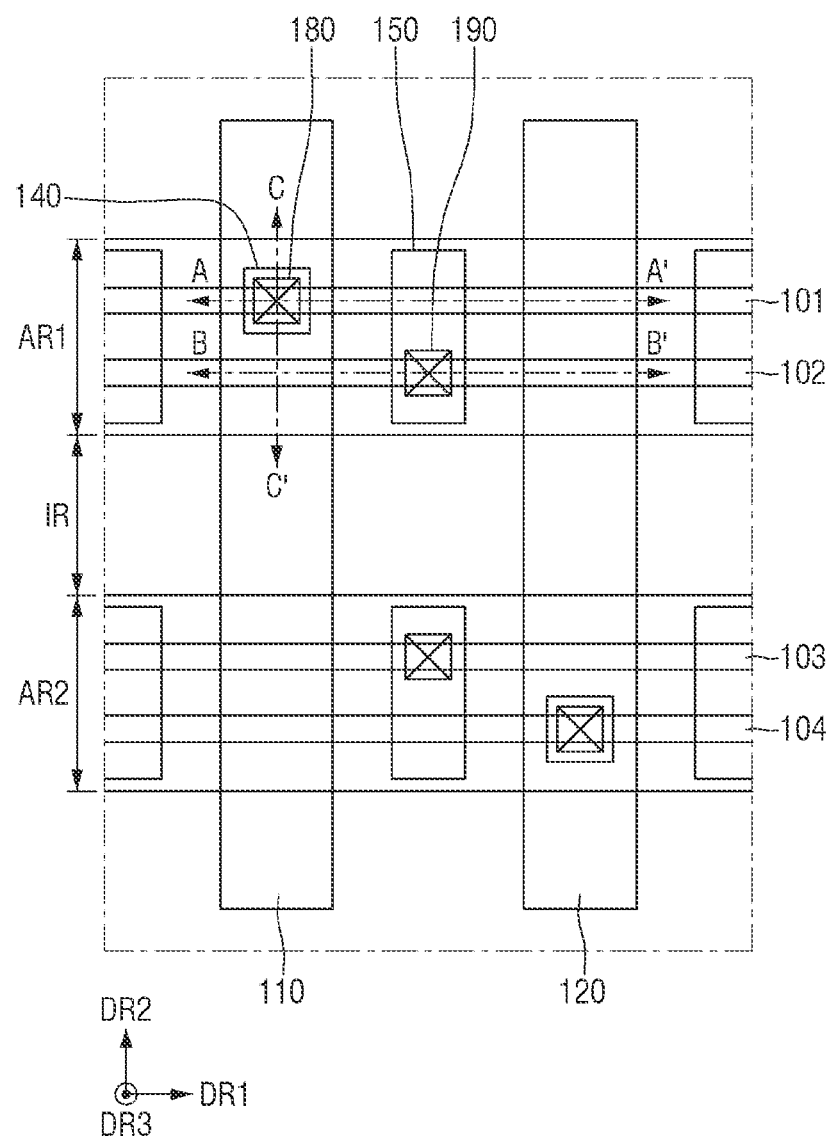
FIG. 1 is a layout diagram for explaining a semiconductor device fabricated by methods for fabricating a semiconductor device using etching compositions according to some embodiments of the present disclosure.

A term "alkyl" means an aliphatic hydrocarbon group. An alkyl part may be a "saturated alkyl" group, which means that no alkene or alkyne part is included. The alkyl part may also be an "unsaturated alkyl" part, which means that at least one alkene or alkyne part is included. The "alkene" part means a group in which at least two carbon atoms are formed by at least one carbon-carbon double bond, and the "alkyne" part means a carbon in which at least two carbon atoms are formed by at least one carbon-carbon triple bonds.

Alkyl groups may be substituted or unsubstituted. When substituted, the substitution group is one or more groups individually and independently selected from cycloalkyl, aryl, heteroaryl, heteroalicyclic, hydroxy, alkoxy, aryloxy, mercapto, alkylthio, arylthio, cyano, halogen, carbonyl, thiocarbonyl, O-carbamyl, N-carbamyl, O-thiocarbamyl, N-thiocarbamyl, C-amido, N-amido, S-sulfonamido, N-sulfonamido, C-carboxy, O-carboxy, isocyanato, thiocyanato, isothiocyanato, nitro, cyril, trihalomethanesulfonyl, amino containing mono- and di-substituted amino groups, and protected derivatives thereof. Typical alkyl groups include, but are not included to, methyl, ethyl, propyl, isopropyl, butyl, isobutyl, tertbutyl, pentyl, hexyl, ethenyl, propenyl, butenyl, cyclopropyl, cyclobutyl, cyclopentyl, cyclohexyl, and the like.

The etching composition described below may be an etching solution for etching cobalt (Co) (e.g., a layer including Co). The etching composition according to some embodiments of the present disclosure may include a chelator, water, an oxidizer, and an organic solvent.

The chelator may be bound to cobalt (Co) to form a compound having a pentagonal ring structure or a compound having a hexagonal ring structure. For example, the chelator may be bound to cobalt (Co) to form a compound having a pentagonal ring structure represented by Chemical formula 1. In each of Chemical Formula 1 and Chemical formula 2, M indicates a metal bound to the chelator. For example, in each of Chemical formula 1 and Chemical formula 2, M represents cobalt (Co) bound to the chelator.

[Chemical formula 1]

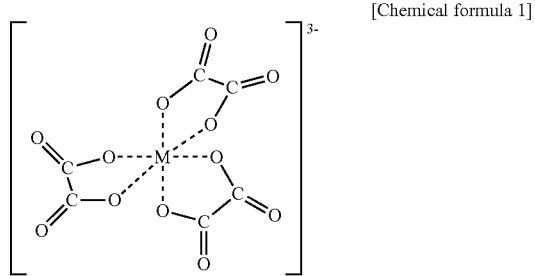

Further, for example, the chelator may be bound to cobalt (Co) to form a compound having a hexagonal ring structure represented by Chemical formula 2.

[Chemical formula 2]

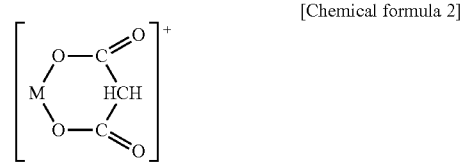

In some embodiments, the chelator may be present in the etching composition in an amount of 1 wt % (% by weight) to 23 wt % based on a total weight of the etching composition. If the chelator is present in an amount of less than 1 wt % based on the total weight of the etching composition, a problem of slow etching rate may occur. In addition, if the chelator is present in excess of 23 wt % based on the total weight of etching composition, there may be a problem of a decrease in the uniformity of the surface of the layer containing cobalt (Co).

The chelator may include, for example, an organic acid, an amine compound and/or a polyhydric alcohol. As used herein the term "and/or" includes any and all combinations of one or more of the associated listed items.

The organic acid may include, for example, methanesulfonic acid, ethanesulfonic acid, benzenesulfonic acid, p-toluenesulfonic acid, sulfobenzoic acid, sulfosuccinic acid, sulfophthalic acid, sulfosalicylic acid, acetic acid, butanoic acid, citric acid, formic acid, caprylic acid, imminodiacetic acid, propenoic acid, isocitric acid, tartaric acid, glycolic acid, malonic acid, oxalic acid, pentanoic acid, phthalic acid, salicylic acid, benzoic acid, lactic acid, propionic acid, glutaric acid, fumaric acid, adipic acid, glutamic acid, glyceric acid, succinic acid, malic acid, maleic acid, glycine, ethylenediaminetetraacetic acid, and/or nitrilotriacetic acid.

The amine compound may be, for example, a compound comprising an alkyl group, a cycloalkyl group or an aryl group that is bound to an amine. The amine compound may include, for example, one or more primary amine group(s) on at least one end (e.g., at one end of the amine compound). The amine compound may include, for example, an amino acid and/or an ammonium salt.

The polyhydric alcohol may include, for example, diols. Further, the polyhydric alcohol may include, for example, glycols such as ethylene glycol and propylene glycol. Further, the polyhydric alcohol may include, for example, glycerine and/or nitrilotriethanol.

That is, the polyhydric alcohol may include one or more species selected from a group consisting of diols, ethylene glycol, propylene glycol, glycerine and nitrilotriethanol.

In some embodiments, water may be present in the etching composition in an amount of 1 wt % to 10 wt % based on the total weight of the etching composition. When water is present in excess of 10 wt % based on the total weight of the etching composition, the layer containing cobalt (Co) is directly etched by water, and the uniformity of the layer may decrease by precipitation of the etched cobalt (Co).

The oxidizer may include, for example, peroxides such as hydrogen peroxide, ammonium persulfate, sodium persulfate, potassium persulfate, and peroxyacetic acid. Further, the oxidizer may include, for example, N-oxide represented by Chemical formula 3.

[Chemical formula 3]

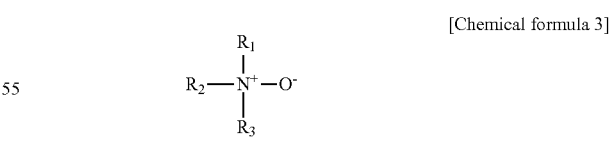

In Chemical formula 3, each of $R_1$ to $R_3$ may independently be an alkyl group of $C_1$ to $C_4$, and $R_2$ and $R_3$ may be bound to each other to form a $C_4$ to $C_6$ heterocycle with the nitrogen atom. $R_2$ and $R_3$ may further include one heteroatom selected from N, O, and S, in addition to the nitrogen atom.

N-oxides may be, for example, any one of N-methylmorpholine-N-oxide (NMMO), trimethylamine-N-oxide, triethylamine-N-oxide, pyridine-N-oxide, 4-nitropyridine-N-oxide, N-ethylmorpholine-N-oxide, N-methylpyrrolidin-N-oxide and N-ethylpyrrolidin-N-oxide.

That is, the oxidizers may include hydrogen peroxide, ammonium persulfate, sodium persulfate, potassium persulfate, peroxyacetic acid, N-methylmorpholine-N-oxide (NMMO), trimethylamine-N-oxide, triethylamine-N-oxide, pyridine-N-oxide, 4-nitropyridine-N-oxide, N-ethylmorpholine-N-oxide, N-methylpyrrolidin-N-oxide, and/or N-ethylpyrrolidin-N-oxide.

In some embodiments, the oxidizer may be present in the etching composition in an amount of 0.7 wt % to 10 wt % based on the total weight of the etching composition. If the oxidizer is present in an amount of less than 0.7 wt %, the etching ability of the layer containing cobalt (Co) may decrease. Further, when the oxidizer is present in an amount of more than 10 wt %, it may be difficult to control the surface roughness of the layer containing cobalt (Co).

As the organic solvent, a protic solvent and/or an aprotic polar solvent may be used. The organic solvent may include, for example, dimethyl sulfoxide, dimethylsulfone, diethylsulfone, methylsulfolane, sulfolane, γ-butylo lactone, delta-valerolactone, diethyl ketone, ethyleneglycol, diethyl acetamide, triethylphosphate, monomethyl ether acetate, and/or 1,3-dimethyl-2-imidazolinone.

For example, the organic solvent may be present in the etching composition in an amount of 50 wt % to 80 wt % based on the total weight of the etching composition.

For example, pH of the etching composition may be in the range from 4 to 9. If pH of the etching composition is less than 4, there may be a problem that the possibility of direct etching with an acid increases and the uniformity of the surface of the layer containing cobalt (Co) decreases. Further, if pH of the etching composition exceeds 9, there may be a problem that a passivation layer is formed on the surface of the layer containing cobalt (Co), and the etching rate decreases.

In some embodiments, the etching composition may not include (i.e., may be devoid of) a fluorine compound. When the etching composition includes a fluorine compound, there may be a problem of damaging the silicon nitride film and the silicon oxide film, which are protective films. However, the present disclosure is not limited thereto. In some other embodiments, the etching composition may include a fluorine compound.

Hereinafter, the effects of etching compositions according to some embodiments of the present disclosure will be described referring to Tables 1 and 2. Table 1 shows Experimental examples (E1 to E21) and Comparative examples (C1 to C10) and provide the amount of each of chelator, organic solvent, oxidizer and water present in the etching composition and the pH of the etching composition. Table 2 shows cobalt (Co) etching rates, a surface roughness of cobalt (Co), and uniformity of the layer containing cobalt (Co) for each the Experimental examples (E1 to E21) and Comparative examples (C1 to C10) shown in Table 1.

TABLE 1

| | Chelator | | | | | | | Organic solvent | | | Oxidizer | | | Total | | |
|---|---|---|---|---|---|---|---|---|---|---|---|---|---|---|---|---|
| | A-1 | A-2 | A-3 | A-4 | A-5 | A-6 | A-7 | B-1 | B-2 | B-3 | C-1 | C-2 | D-1 | Water | weight | pH |
| E1 | 23.00 | | | | | | | 61.00 | | | 5.00 | | 1.00 | 10.00 | 100 | 7.4 |
| E2 | 20.00 | | | | | | | 66.00 | | | 5.00 | | 0.80 | 8.20 | 100 | 7.3 |
| E3 | 15.00 | | | | | | | 73.50 | | | 5.00 | | 0.30 | 6.20 | 100 | 7.1 |
| E4 | 10.00 | | | | | | | 80.00 | | | 5.00 | | | 5.00 | 100 | 7.0 |
| E5 | 5.00 | | | | | | | 85.00 | | | 5.00 | | | 5.00 | 100 | 7.8 |
| E6 | 3.00 | | | | | | | 87.00 | | | 5.00 | | | 5.00 | 100 | 8.4 |
| E7 | 23.00 | | | | | | | 70.51 | | | | 0.76 | 1.80 | 3.93 | 100 | 4.8 |
| E8 | 20.00 | | | | | | | 74.41 | | | | 0.76 | 1.40 | 3.43 | 100 | 5.5 |
| E9 | 15.00 | | | | | | | 80.76 | | | | 0.76 | 0.80 | 2.68 | 100 | 5.2 |
| E10 | 10.00 | | | | | | | 87.38 | | | | 0.76 | 0.08 | 1.78 | 100 | 5.0 |
| E11 | 5.00 | | | | | | | 92.56 | | | | 0.76 | | 1.68 | 100 | 4.8 |
| E12 | 3.00 | | | | | | | 94.56 | | | | 0.76 | | 1.68 | 100 | 5.4 |
| E13 | 1.00 | | | | | | | 96.56 | | | | 0.76 | | 1.68 | 100 | 6.2 |
| E14 | | 4.00 | | | | | | 86.00 | | | 5.00 | | | 5.00 | 100 | 6.5 |
| E15 | | | 7.00 | | | | | 83.00 | | | 5.00 | | | 5.00 | 100 | 5.8 |
| E16 | | | | 6.00 | | | | 84.00 | | | 5.00 | | | 5.00 | 100 | 6.2 |
| E17 | | | | | 15.00 | | | 75.00 | | | 5.00 | | | 5.00 | 100 | 7.0 |
| E18 | | | | | | 5.00 | | 85.00 | | | 5.00 | | | 5.00 | 100 | 8.0 |
| E19 | | | | | | | 2.00 | 95.56 | | | | 0.76 | | 1.68 | 100 | 8.8 |
| E20 | 5.00 | | | | | | | | 85.00 | | 5.00 | | | 5.00 | 100 | 5.0 |
| E21 | 5.00 | | | | | | | | | 85.00 | 5.00 | | | 5.00 | 100 | 4.8 |
| C1 | | | | | | | | 90.00 | | | 5.00 | | | 5.00 | 100 | 13.0 |
| C2 | | | | | | | | 97.56 | | | | 0.76 | | 1.68 | 100 | 9.0 |
| C3 | 0.50 | | | | | | | 89.50 | | | 5.00 | | | 5.00 | 100 | 12.0 |
| C4 | 0.50 | | | | | | | 97.06 | | | | 0.76 | | 1.68 | 100 | 9.2 |
| C5 | 5.00 | | | | | | | 75.00 | | | 5.00 | | | 15.00 | 100 | 6.0 |
| C6 | 5.00 | | | | | | | 79.30 | | | | 0.70 | | 15.00 | 100 | 5.1 |
| C7 | 5.00 | | | | | | | 70.00 | | | 5.00 | | | 20.00 | 100 | 5.8 |
| C8 | 5.00 | | | | | | | 74.30 | | | | 0.70 | | 20.00 | 100 | 4.8 |
| C9 | 20.00 | | | | | | | 77.30 | | | | 0.70 | | 2.00 | 100 | 2.8 |
| C10 | 5.00 | | | | | | | 75.00 | | | 15.00 | | | 15.00 | 100 | 13.0 |

In Table 1, A-1 is glycolic acid, A-2 is oxalic acid, A-3 is maleic acid, A-4 is malonic acid, A-5 is propionic acid, A-6 is glycerine, A-7 is ethylene diamine, B-1 is dimethyl sulfoxide, B-2 is γ-butyrolactone, B-3 is sulfolane, C-1 is N-methylmorpholine-N-oxide (NMMO), C-2 is hydrogen peroxide ($H_2O_2$), and D-1 is tetramethylammonium hydroxide.

TABLE 2

| Classification | Cobalt etching rate (Å/min) | Surface roughness (Å) of cobalt | Uniformity of layer |
| --- | --- | --- | --- |
| E1 | ⊚ | Δ | ○ |
| E2 | ⊚ | ○ | ○ |
| E3 | ⊚ | ○ | ○ |
| E4 | ⊚ | ⊚ | ○ |
| E5 | ○ | ⊚ | ○ |
| E6 | ○ | ⊚ | ○ |
| E7 | ⊚ | Δ | ○ |
| E8 | ⊚ | ○ | ○ |
| E9 | ⊚ | ○ | ○ |
| E10 | ⊚ | ⊚ | ○ |
| E11 | ○ | ⊚ | ○ |
| E12 | ○ | ⊚ | ○ |
| E13 | ○ | ○ | ○ |
| E14 | ⊚ | ⊚ | ○ |
| E15 | ⊚ | ⊚ | ○ |
| E16 | ⊚ | ⊚ | ○ |
| E17 | ○ | Δ | ○ |
| E18 | ○ | Δ | ○ |
| E19 | ○ | ⊚ | ○ |
| E20 | ⊚ | ⊚ | ○ |
| E21 | ⊚ | ⊚ | ○ |
| C1 | X | X | ○ |
| C2 | X | X | ○ |
| C3 | X | X | ○ |
| C4 | X | X | ○ |
| C5 | ○ | X | X |
| C6 | ○ | X | X |
| C7 | ○ | X | X |
| C8 | ○ | X | X |
| C9 | ⊚ | X | ○ |
| C10 | X | X | X |

The experimental data shown in Table 2 is data measured by performing experiment on a substrate formed by cutting a wafer, in which a layer containing cobalt (Co) is deposited on a silicon wafer at a thickness of 350 Å, into size of 2×2 cm. Table 2 shows data measured in a state in which the substrate is immersed in the etching solution composition of each of Experimental examples (E1 to E21) and Comparative examples (C1 to C10) in a constant temperature bath at 60° C. for 1 minute, the substrate is taken out and washed with water, and then is dried using $N_2$.

As the cobalt etching rate in Table 2, the thickness of the layer before and after immersion was measured using XRF. The unit of cobalt etching rate is A/min. In Table 2, ⊚ indicates a case where the cobalt etching rate is 80 Å/min or more, ○ indicates a case where the cobalt etching rate is 40 Å/min to less than 80 Å/min, and X indicates a case where cobalt is not etched.

As the surface roughness of cobalt in Table 2, a change in surface roughness of the substrate was measured by AFM. The unit of surface roughness of cobalt is A. In Table 2, ⊚, indicates a case where the surface roughness of cobalt is less than root mean square (RMS) 10 Å, ○ indicates a case where the surface roughness of cobalt is RMS 10 Å to less than 15 Å, and Δ indicates a case where the surface roughness of cobalt is RMS 15 Å to less than 20 Å, and X indicates a case where the surface roughness of cobalt is RMS 20 Å or more.

As the uniformity of the layer in Table 2, the surface state of the layer was measured through SEM cross-section of the substrate. In Table 2, ○ indicates a case where the surface of the layer is uniformly formed, and X indicates a case where the surface of the layer is formed non-uniformly.

Referring to Tables 1 and 2, it is understood that the etching compositions of Experimental examples 1 to 21 (E1 to E21) not only achieve an etching rate of a certain level or higher, but also surface of the layer is formed uniformly after etching. Since each of Experimental example 17 (E17) and Experimental example 18 (E18) does not achieve the coordinate bond of the pentagonal ring structure or the hexagonal ring structure with cobalt, there is a tendency that the stability of the coordinate bond is lowered, and the surface roughness is formed somewhat unevenly.

On the other hand, each of Comparative example 1 (C1) and Comparative example 2 (C2) did not achieve the desired etching rate and uniformity when the chelator is not presented. Each of Comparative example 3 (C3) and Comparative example 4 (C4) did not achieve the desired etching rate and uniformity, since the chelator deviated from the content range. In each of Comparative example 5 (C5) to Comparative example 8 (C8), the desired etching rate can be obtained by increasing the water content, but the surface of the layer is formed unevenly. In Comparative example 9 (C9), which deviates from the pH range, the desired etching rate can be obtained, but the surface of the layer is formed unevenly. In Comparative example 10 (C10), which deviates from the content range of the oxidizer and deviates from the pH range, since a passivation layer is formed, the desired etching rate cannot be obtained, and the surface of the layer is also formed unevenly.

In etching compositions according to some embodiments of the present disclosure, the chelator is bound to cobalt (Co) to form a compound having a pentagonal ring structure or a compound having a hexagonal ring structure, thereby forming a stable coordinate bond with cobalt (Co). That is, in etching compositions according to some embodiments of the present disclosure, since the chelator forms a stable chelation with cobalt (Co), a layer including cobalt (Co) can be uniformly etched by the etching compositions.

Hereinafter, a semiconductor device fabricated by a method for fabricating a semiconductor device using the etching compositions according to some embodiments of the present disclosure will be described referring to FIGS. 1 to 4.

Hereinafter, although it is explained that the semiconductor device includes a fin-type transistor (FinFET) including a fin-type pattern-shaped channel region, this is an example, and the present disclosure is not limited thereto. In some other embodiments, the semiconductor device may, of course, include transistors including nanowire or nanosheet, a tunneling transistor (tunneling FET) or a three-dimensional (3D) transistor. In some other embodiments, the semiconductor device may also include a planar transistor, a bipolar junction transistor, a horizontal double diffusion transistor (LDMOS), and the like.

Figure 2:
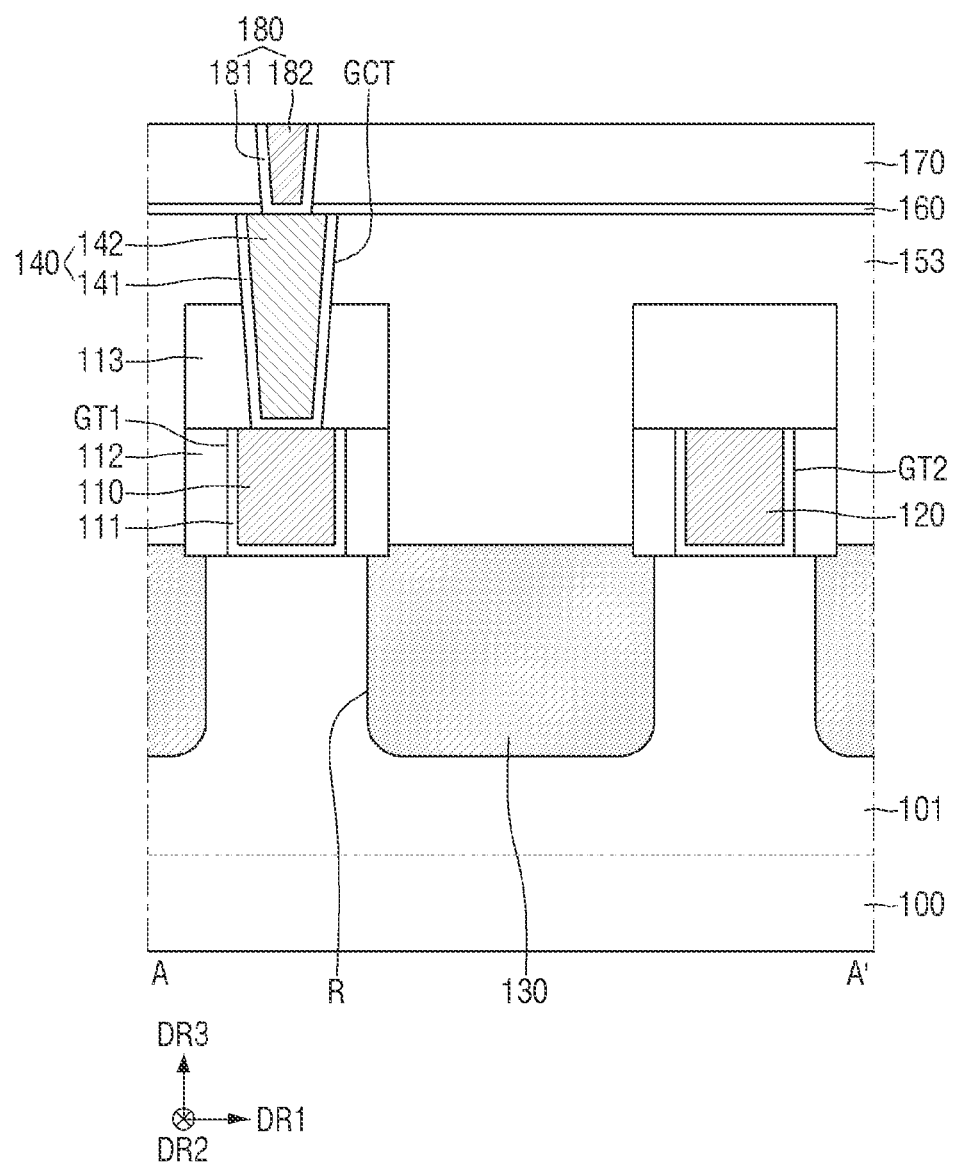
FIG. 2 is a cross-sectional view taken along A-A' of FIG. 1.
Figure 3:
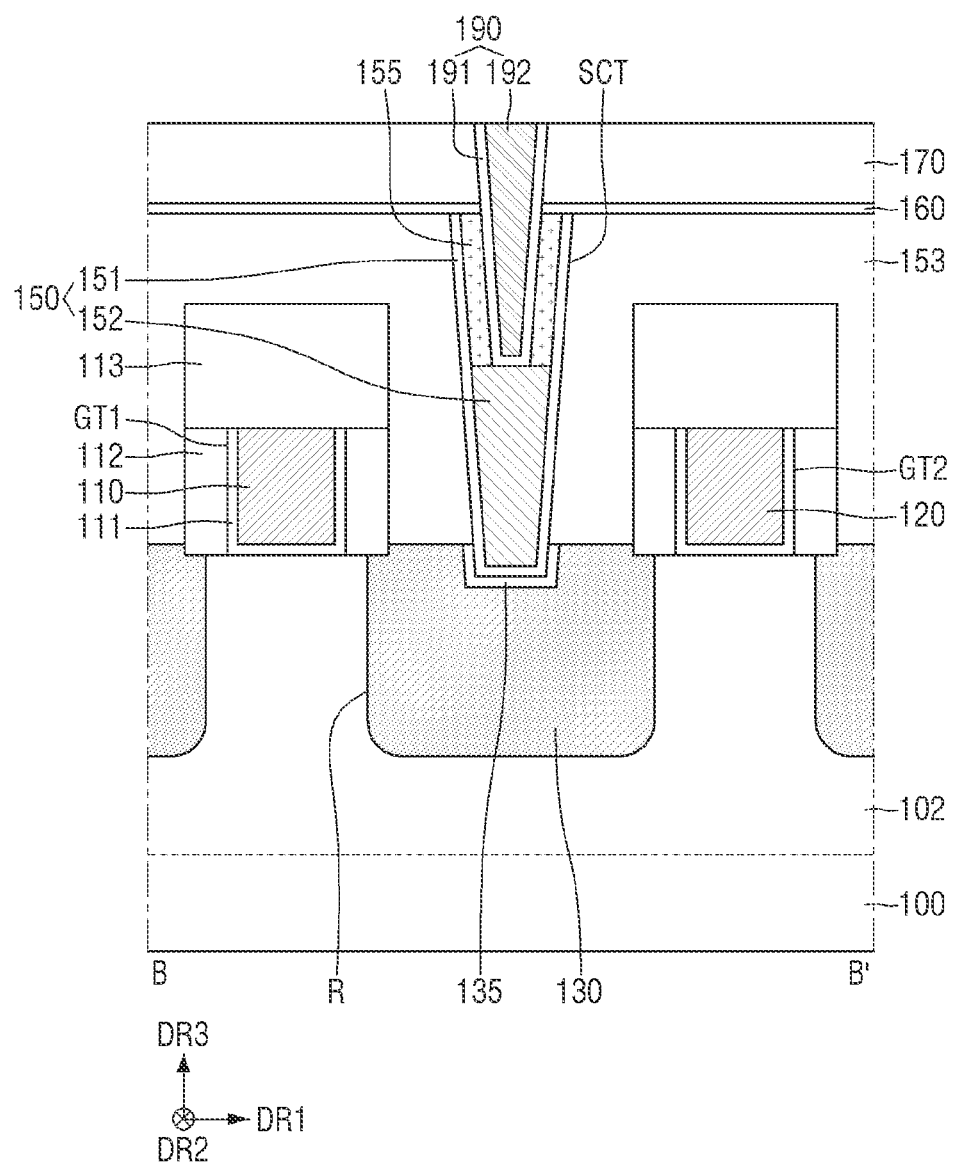
FIG. 3 is a cross-sectional view taken along B-B' of FIG. 1.
Figure 4:
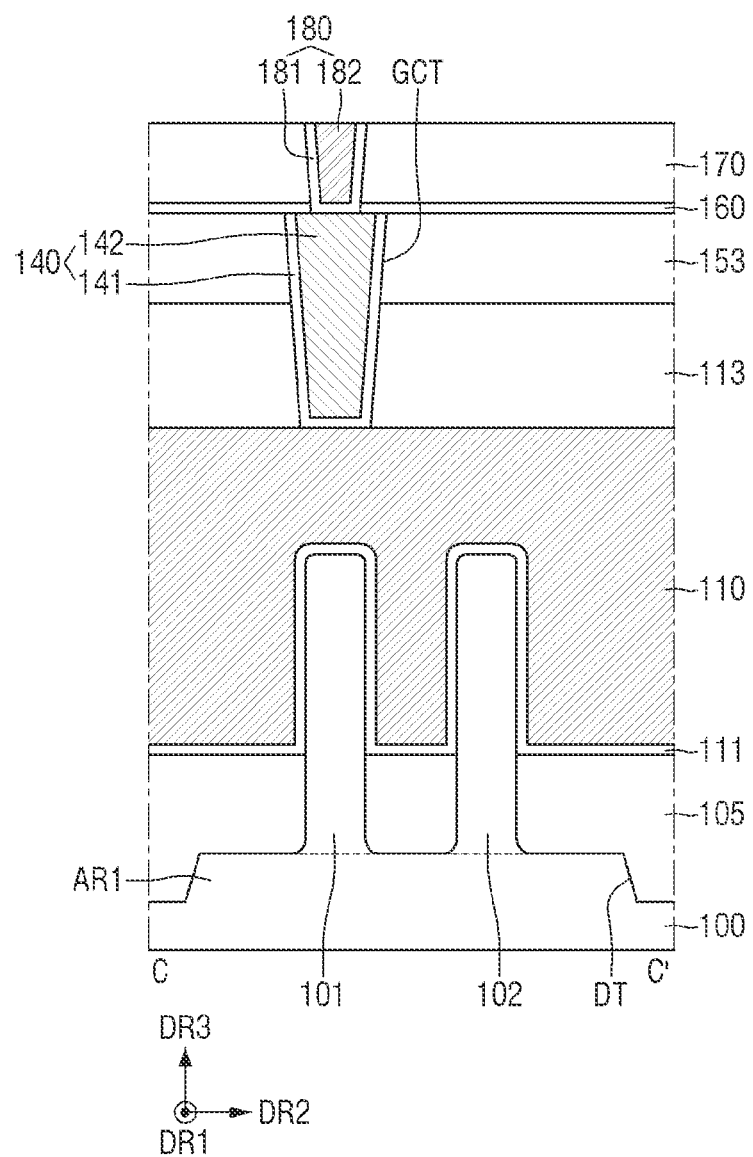
FIG. 4 is a cross-sectional view taken along C-C' of FIG. 1.

FIG. 1 is a layout diagram for explaining a semiconductor device fabricated by the method for fabricating the semiconductor device using the etching compositions according to some embodiments of the present disclosure. FIG. 2 is a cross-sectional view taken along A-A' of FIG. 1. FIG. 3 is a cross-sectional view taken along B-B' of FIG. 1. FIG. 4 is a cross-sectional view taken along C-C' of FIG. 1.

Referring to FIGS. 1 to 4, the semiconductor device fabricated by the method for fabricating the semiconductor device using the etching compositions according to some embodiments of the present disclosure includes a substrate 100, first to fourth active patterns 101 and 102, 103, and 104, a field insulating film 105, a first gate electrode 110, a second gate electrode 120, a gate insulating film 111, a gate spacer 112, a capping pattern 113, a source/drain region 130, a silicide film 135, a gate contact 140, a source/drain contact 150, a first interlayer insulating layer 153, a second interlayer insulating layer 155, an etching stop film 160, a third interlayer insulating layer 170, a first via 180, and a second via 190.

The substrate 100 may be, for example, a silicon substrate or an SOI (silicon-on-insulator). In some embodiments, the substrate 100 may include, for example, silicon germanium, SGOI (silicon germanium on insulator), indium antimonide, lead tellurium compounds, indium arsenic, indium phosphide, gallium arsenide or gallium antimonide, the present disclosure is not limited thereto.

A first active region AR1, a second active region AR2, and an element isolation region IR may be defined on the substrate 100. The element isolation region IR may be defined by a deep trench DT. The first active region AR1 and the second active region AR2 may be defined by the element isolation region IR. For example, the element isolation region IR may be placed between the first active region AR1 and the second active region AR2.

Each of the first and second active patterns 101 and 102 may be formed on the first active region AR1. Each of the first and second active patterns 101 and 102 may protrude from the first active region AR1 of the substrate 100 of. Each of the first and second active patterns 101 and 102 may extend longitudinally in a first horizontal direction DR1. The first active pattern 101 may be spaced apart from the second active pattern 102 in a second horizontal direction DR2 that is different from (e.g., traverses or intersects) the first horizontal direction DR1.

Each of the third and fourth active patterns 103 and 104 may be formed on the second active region AR2. Each of the third and fourth active patterns 103 and 104 may protrude from the second active region AR2 of the substrate 100. Each of the third and fourth active patterns 103 and 104 may extend longitudinally in the first horizontal direction DR1. The third active pattern 103 may be spaced apart from the fourth active pattern 104 in the second horizontal direction DR2.

Each of the first to fourth active patterns 101, 102, 103 and 104 may be a portion of the substrate 100, and may include an epitaxial layer that is grown from the substrate 100. Each of the first to fourth active patterns 101, 102, 103 and 104 may include, for example, silicon and/or germanium which is an elemental semiconductor material. In some embodiments, each of the first to fourth active patterns 101, 102, 103 and 104 may include a compound semiconductor, and may include, for example, a group IV-IV compound semiconductor and/or a group III-V compound semiconductor.

The group IV-IV compound semiconductors may be, for example, a binary compound or a ternary compound containing at least two or more of carbon (C), silicon (Si), germanium (Ge), and tin (Sn), or a compound obtained by doping these elements with a group IV element. The group III-V compound semiconductor may be, for example, one of a binary compound, a ternary compound or a quaternary compound formed by bonding at least one of aluminum (Al), gallium (Ga) and indium (In) as a group III element with one of phosphorus (P), arsenic (As) and antimony (Sb) as a group V element.

The field insulating film 105 may be placed on the substrate 100. The field insulating film 105 may be placed over the first active region AR1, the second active region AR2, and the element isolation region IR. The field insulating film 105 may fill the deep trench DT.

The field insulating film 105 may be placed on a part of each side wall (e.g., a lower portion of the side wall as illustrated in FIG. 4) of the first to fourth active patterns 101, 102, 103 and 104. Each of the first to fourth active patterns 101, 102, 103 and 104 may protrude upward from the upper surface of the field insulating film 105. The field insulating film 105 may include, for example, an oxide film, a nitride film, an oxynitride film or a combination film thereof.

The first gate electrode 110 may extend in the second horizontal direction DR2. The first gate electrode 110 may be placed on each of the first to fourth active patterns 101, 102, 103 and 104. Although FIG. 1 shows that the first gate electrode 110 is placed over the first active region AR1 and the second active region AR2, this is merely for convenience of explanation, and the present disclosure is not limited thereto. In some other embodiments, the first gate electrode 110 may be separated into two parts, which are placed over the first active region AR1 and the second active region AR2, respectively. As used herein, "an element A extends in a direction X" (or similar language) may mean that the element A extends longitudinally in the direction X.

The second gate electrode 120 may extend in the second horizontal direction DR2. The second gate electrode 120 may be spaced apart from the first gate electrode 110 in the first horizontal direction DR1. The second gate electrode 120 may be placed on each of the first to fourth active patterns 101, 102, 103 and 104. Although FIG. 1 shows that the second gate electrode 120 is placed over the first active region AR1 and the second active region AR2, this is merely for convenience of explanation, and the present disclosure is not limited thereto. In some other embodiments, the second gate electrode 120 may be separated into two parts, which are placed on the first active region AR1 and the second active region AR2, respectively.

Each of the first gate electrode 110 and the second gate electrode 120 may include, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), and/or vanadium (V). Each of the first gate electrode 110 and the second gate electrode 120 may include a conductive metal oxide, a conductive metal oxynitride, and the like, and may also include an oxidized form of the above-mentioned materials.

The gate spacer 112 may be placed on both side walls of the first gate electrode 110 and both side walls of the second gate electrode 120. That is, the first gate electrode 110 may be placed inside the first gate trench GT1 defined by the gate spacer 112. Further, the second gate electrode 120 may be placed inside the second gate trench GT2 defined by the gate spacer 112.

The gate spacer 112 may include, for example, silicon nitride (SiN), silicon oxynitride (SiON), silicon oxide (SiO$_2$), silicon oxycarbonitride (SiOCN), silicon boronitride (SiBN), silicon oxyboronitride (SiOBN), and/or silicon oxycarbide (SiOC).

The gate insulating film 111 may be placed inside the first gate trench GT1 along the side walls and the bottom surface of the first gate electrode 110. Further, the gate insulating film 111 may be placed inside the second gate trench GT2 along the side walls and the bottom surface of the second gate electrode 120.

The gate insulating film 111 may include silicon oxide, silicon oxynitride, silicon nitride or a high dielectric constant material having a higher dielectric constant than silicon oxide. The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The capping pattern 113 may extend on the first gate electrode 110, the gate insulating film 111 and the gate spacer 112 in the second horizontal direction DR2. Also, the capping pattern 113 may extend on the second gate electrode 120, the gate insulating film 111 and the gate spacer 112 in the second horizontal direction DR2.

The capping pattern 113 may include, for example, silicon nitride (SiN), silicon oxynitride (SiON), silicon oxide (SiO₂), silicon carbonitride (SiCN), and/or silicon oxycarbonitride (SiOCN).

The source/drain region 130 may be placed at least on one side of each of the first gate electrode 110 and the second gate electrode 120. For example, the source/drain region 130 may be placed inside a recess R formed between the first gate electrode 110 and the second gate electrode 120.

The first interlayer insulating layer 153 may be placed on the field insulating film 105. The first interlayer insulating layer 153 may be placed to cover the gate spacer 112, the capping pattern 113 and the source/drain region 130.

The first interlayer insulating layer 153 may include, for example, silicon oxide, silicon nitride, silicon oxynitride and/or a low dielectric constant material. The low dielectric constant material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof. However, the present disclosure is not limited thereto.

The gate contact 140 may be placed, for example, on the first active region AR1. The gate contact 140 may be placed on the first gate electrode 110 placed on the first active pattern 101. The gate contact 140 may be placed inside a first contact trench GCT that penetrates the first interlayer insulating layer 153 and the capping pattern 113 in the vertical direction DR3. The gate contact 140 may be connected to the first gate electrode 110.

Although FIG. 1 shows that the gate contact 140 is placed on the first active region AR1, the present disclosure is not limited thereto. In some other embodiments, the gate contact 140 may also be placed on the element isolation region IR.

The gate contact 140 may include a first contact barrier layer 141 and a first contact filling layer 142. The first contact barrier layer 141 may be placed along the side walls and the bottom surface of the first contact trench GCT. The first contact barrier layer 141 may include, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and/or rhodium (Rh). The first contact filling layer 142 may include, for example, aluminum (Al), copper (Cu), tungsten (W), cobalt (Co), ruthenium (Ru), and/or molybdenum (Mo).

The first contact filling layer 142 may fill the first contact trench GCT on the first contact barrier layer 141. In some embodiments, the first contact filling layer 142 may include, for example, cobalt (Co).

The source/drain contact 150 may be placed on the source/drain region 130. The source/drain contact 150 may be placed, for example, on the source/drain region 130 placed between the first gate electrode 110 and the second gate electrode 120 on the first active region AR1. The source/drain contact 150 may be placed inside a second contact trench SCT that penetrates the first interlayer insulating layer 153 in the vertical direction DR3. The source/drain contact 150 may be connected to the source/drain region 130.

The source/drain contact 150 may include a second contact barrier layer 151 and a second contact filling layer 152. The second contact barrier layer 151 may be placed along the side walls and the bottom surface of the second contact trench SCT.

The second contact barrier layer 151 may include, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and/or rhodium (Rh). The second contact filling layer 152 may include, for example, aluminum (Al), copper (Cu), tungsten (W), cobalt (Co), ruthenium (Ru), and/or molybdenum (Mo).

The second contact filling layer 152 may fill a part (e.g., a lower portion as illustrated in FIG. 3) of the second contact trench SCT on the second contact barrier layer 151. An upper surface of the second contact filling layer 152 may be formed to be lower than an upper surface of the second contact barrier layer 151. In some embodiments, the second contact filling layer 152 may include, for example, cobalt (Co). As used herein, "a surface V is lower than a surface W" (or similar language) means that the surface V is closer than the surface W to a substrate.

The silicide film 135 may be placed between the source/drain region 130 and the source/drain contact 150. The silicide film 135 may be formed along a profile of an interface between the source/drain region 130 and the source/drain contact 150. The silicide film 135 may include, for example, a metal silicide substance.

The second interlayer insulating layer 155 may be placed on the upper surface of the second contact filling layer 152 inside the second contact trench SCT. The second contact trench SCT may be completely filled by the second contact filling layer 152 and the second interlayer insulating layer 155. The second contact barrier layer 151 may be placed between the second interlayer insulating layer 155 and the first interlayer insulating layer 153. However, the present disclosure is not limited thereto.

The second interlayer insulating layer 155 may include, for example, silicon oxide, silicon nitride, silicon oxynitride and/or a low dielectric constant material. In some embodiments, the second interlayer insulating layer 155 may include the same material as the first interlayer insulating layer 153, but the present disclosure is not limited thereto. In some other embodiments, the second interlayer insulating layer 155 may include a material different from the first interlayer insulating layer 153.

The etching stop film 160 may be placed on the first interlayer insulating layer 153 and the second interlayer insulating layer 155. The etching stop film 160 may include, for example, silicon nitride (SiN), silicon oxynitride (SiON), silicon carbonitride (SiCN), and/or silicon oxycarbide (SiCO).

The third interlayer insulating layer 170 may be placed on the etching stop film 160. The third interlayer insulating layer 170 may include, for example, silicon nitride, silicon oxynitride and/or a low dielectric constant material.

The first via 180 may be placed on the gate contact 140. The first via 180 penetrates the third interlayer insulating layer 170 and the etching stop film 160 in the vertical direction DR3, and may be connected to the gate contact 140.

The first via 180 may include a first via barrier film 181 and a first via filling film 182. The first via barrier film 181 may be formed on the side walls and bottom surface of the first via 180. The first via filling film 182 may be placed on the first via barrier film 181.

The second via 190 may be placed on the source/drain contact 150. The second via 190 penetrates the third interlayer insulating layer 170, the etching stop film 160, and the second interlayer insulating layer 155 in the vertical direction DR3, and may be connected to the source/drain contact 150.

The second via 190 may include a second via barrier film 191 and a second via filling film 192. The second via barrier film 191 may be formed on side walls and bottom surface of the second via 190. The second via filling film 192 may be placed on the second via barrier film 191.

Hereinafter, a method for fabricating a semiconductor device using the etching compositions according to some embodiments of the present disclosure will be described referring to FIGS. 3 and 5 to 14.

FIGS. 5 to 14 are intermediate stage diagrams for explaining the methods for fabricating the semiconductor device using etching compositions according to some embodiments of the present disclosure.

Figure 5:
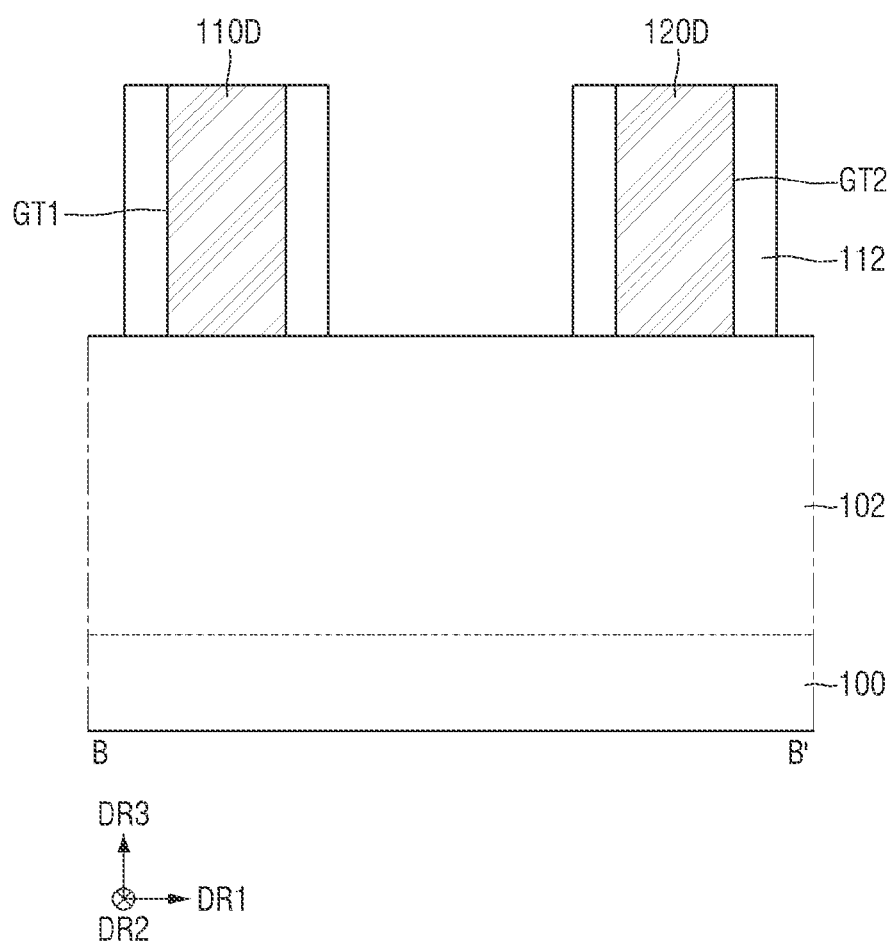
FIGS. 5 to 14 are intermediate stage diagrams for explaining a method for fabricating a semiconductor device using etching compositions according to some embodiments of the present disclosure.

Referring to FIG. 5, for example, a second active pattern 102 extending in the first horizontal direction DR1 may be formed on the substrate 100.

Subsequently, a first dummy gate 110D and a second dummy gate 120D may be formed on the substrate 100 and the second active pattern 102. Each of the first dummy gate 110D and the second dummy gate 120D may extend in the second horizontal direction DR2. The second dummy gate 120D may be spaced apart from the first dummy gate 110D in the first horizontal direction DR1. Subsequently, a gate spacer 112 may be formed on side walls of each of the first dummy gate 110D and the second dummy gate 120D.

Figure 6:
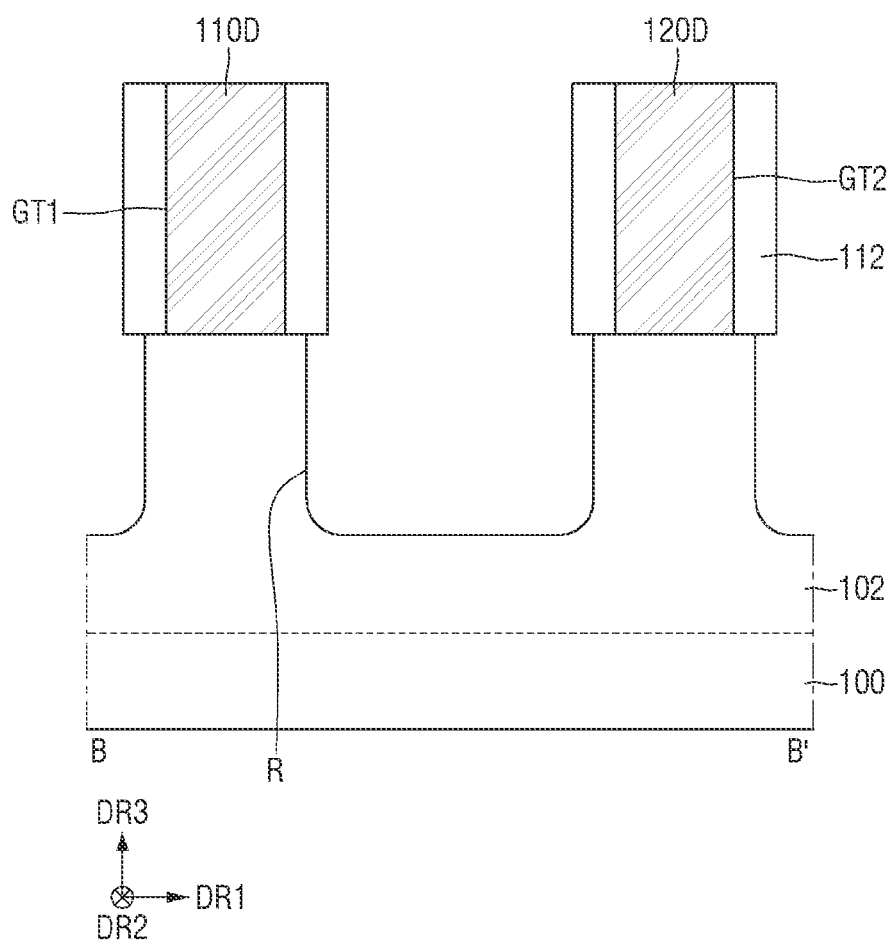

Referring to FIG. 6, a recess R may be formed inside the second active pattern 102, using the first dummy gate 110D, the second dummy gate 120D and the gate spacer 112 as masks. The recess R may be formed, for example, on both sides of each of the first dummy gate 110D and the second dummy gate 120D.

Figure 7:
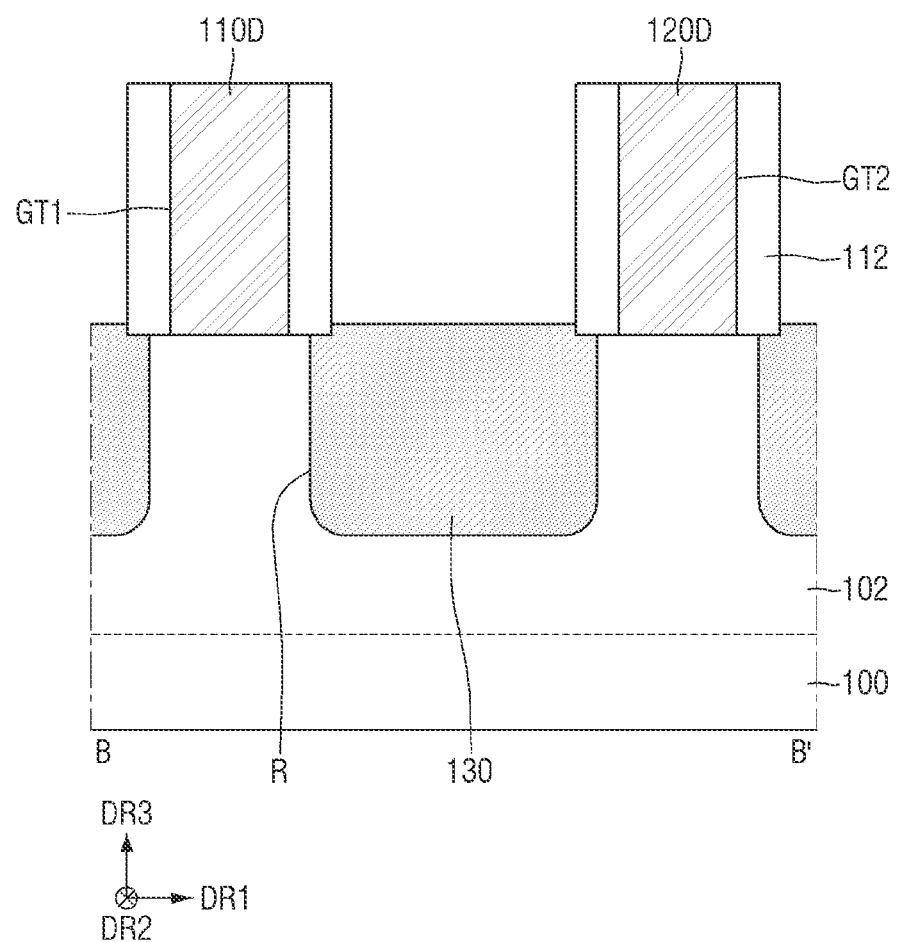

Referring to FIG. 7, a source/drain region 130 may be formed inside the recess R. Although FIG. 7 shows that the upper surface of the source/drain region 130 is formed to be higher than the upper surface of the second active pattern 102, the present disclosure is not limited thereto.

Figure 8:
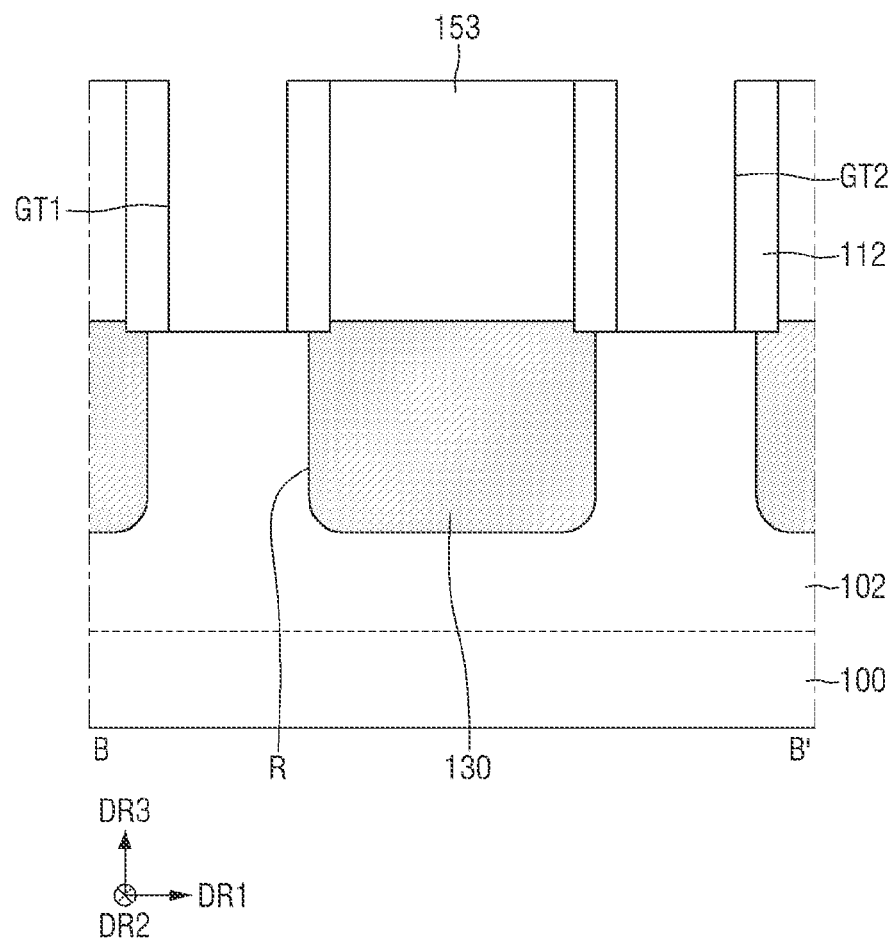

Referring to FIG. 8, the first interlayer insulating layer 153 may be formed to cover the first dummy gate 110D, the second dummy gate 120D, the gate spacer 112 and the source/drain region 130. Subsequently, the first dummy gate 110D and the second dummy gate 120D may be exposed through a flattening process (e.g., a CMP process). Subsequently, the first dummy gate 110D and the second dummy gate 120D may be removed.

Figure 9:
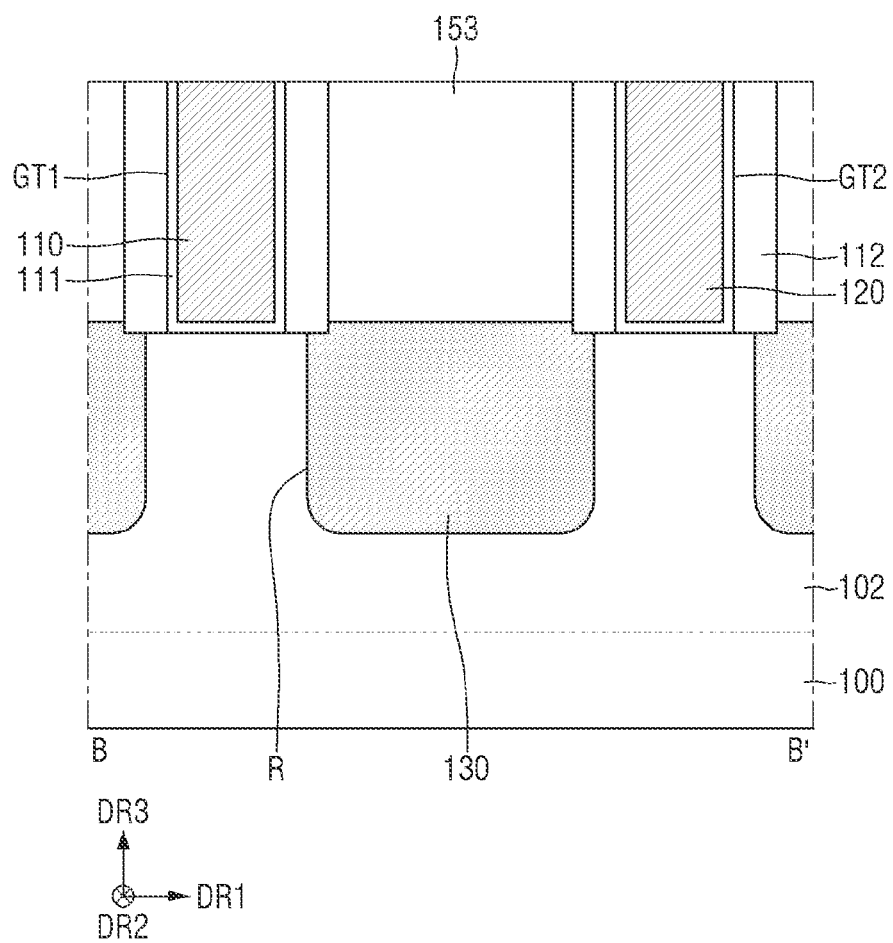

Referring to FIG. 9, the gate insulating film 111 and the first gate electrode 110 may be formed inside the first gate trench GT1 from which the first dummy gate 110D was removed. Further, the gate insulating film 111 and the second gate electrode 120 may be formed inside the second gate trench GT2 from which the second dummy gate 120D was removed.

Figure 10:
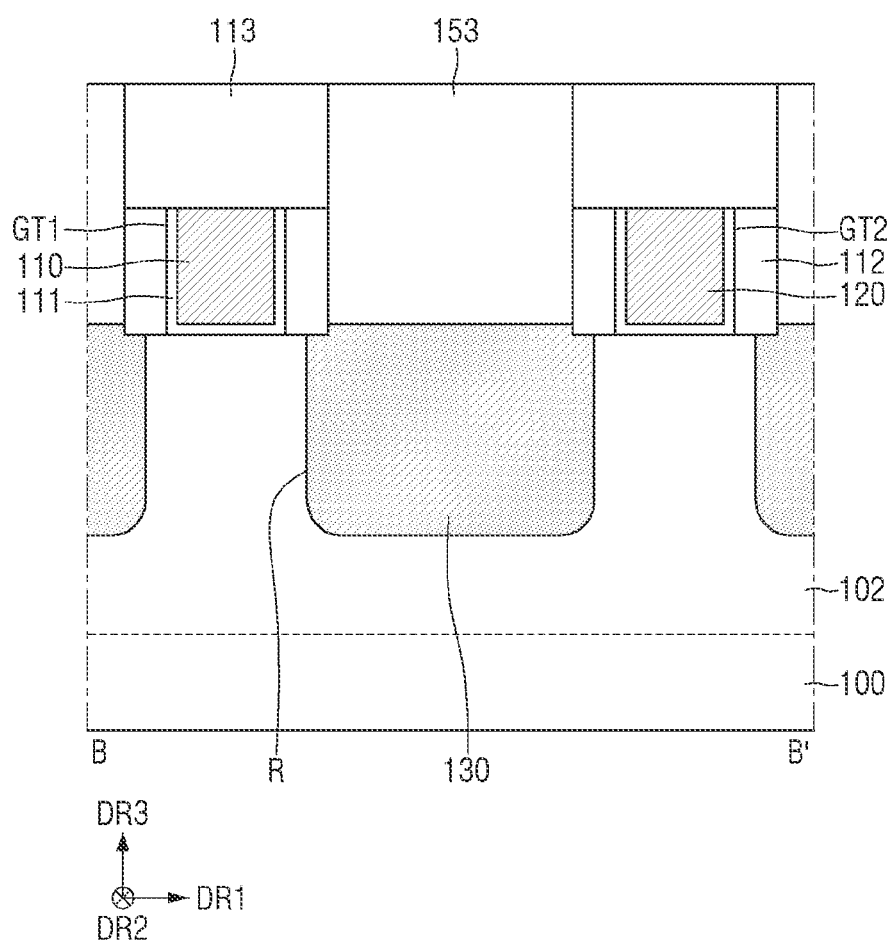

Referring to FIG. 10, each of the gate spacer 112, the gate insulating film 111, the first gate electrode 110 and the second gate electrode 120 may be partially removed. Subsequently, the capping pattern 113 may be formed in a portion from which each of the gate spacer 112, the gate insulating film 111, the first gate electrode 110 and the second gate electrode 120 was partially removed.

Figure 11:
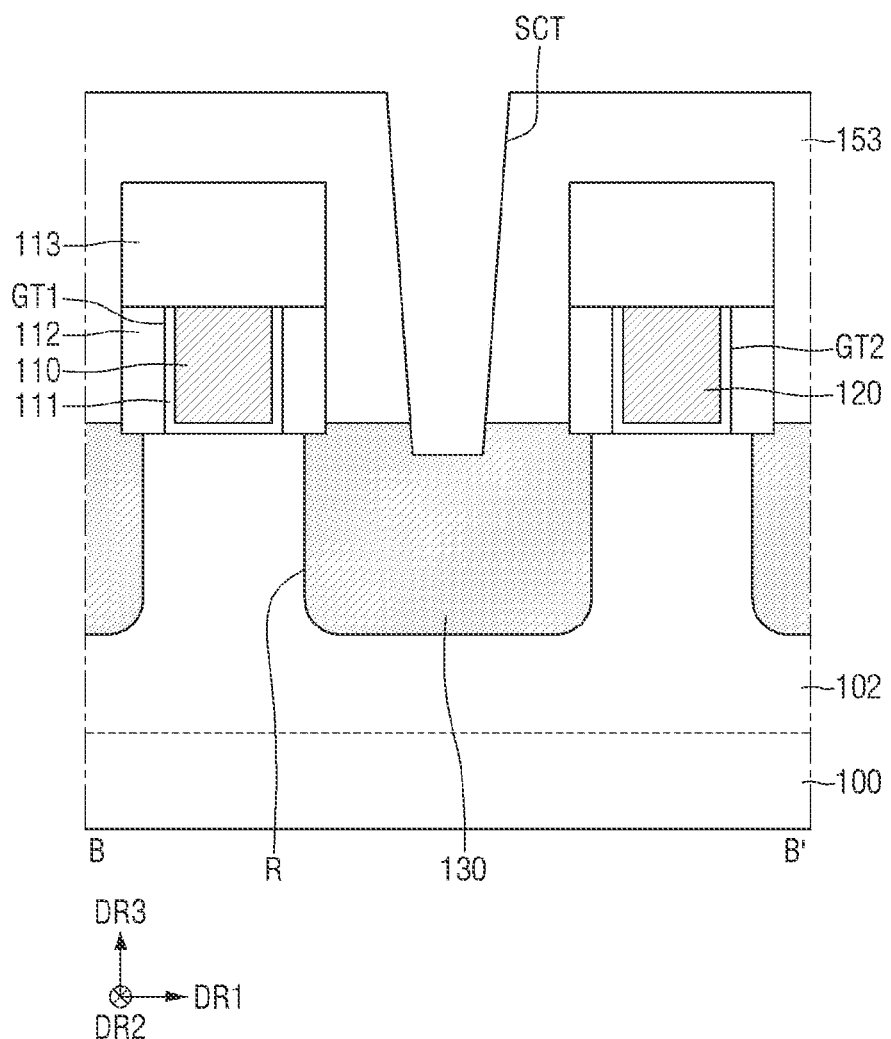

Referring to FIG. 11, the first interlayer insulating layer 153 may be additionally formed on the capping pattern 113 and the first interlayer insulating layer 153. However, the present disclosure is not limited thereto. In some other embodiments, additional formation of the first interlayer insulating layer 153 may be omitted.

Subsequently, a second contact trench SCT may be formed on the source/drain region 130 to penetrate the first interlayer insulating layer 153 in the vertical direction DR3. The second contact trench SCT may extend into the source/drain region 130.

Figure 12:
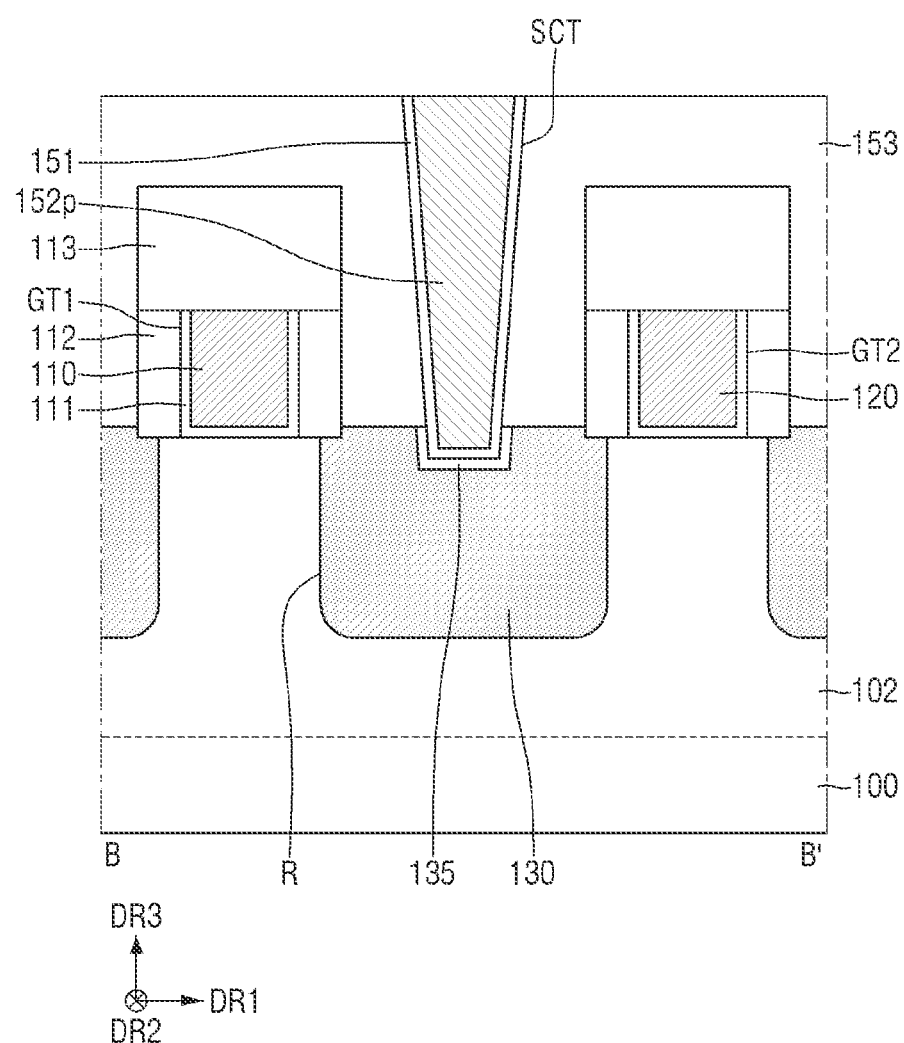

Referring to FIG. 12, a silicide film 135 may be formed in the source/drain region 130 exposed to the second contact trench SCT. Subsequently, a second contact barrier layer 151 may be formed inside the second contact trench SCT. The second contact barrier layer 151 may be formed along the side walls and bottom surface of the second contact trench SCT.

Subsequently, a preliminary second contact filling layer 152p may be formed on the second contact barrier layer 151 to fill the inside of the second contact trench SCT. The preliminary second contact filling layer 152p may include, for example, cobalt (Co).

Figure 13:
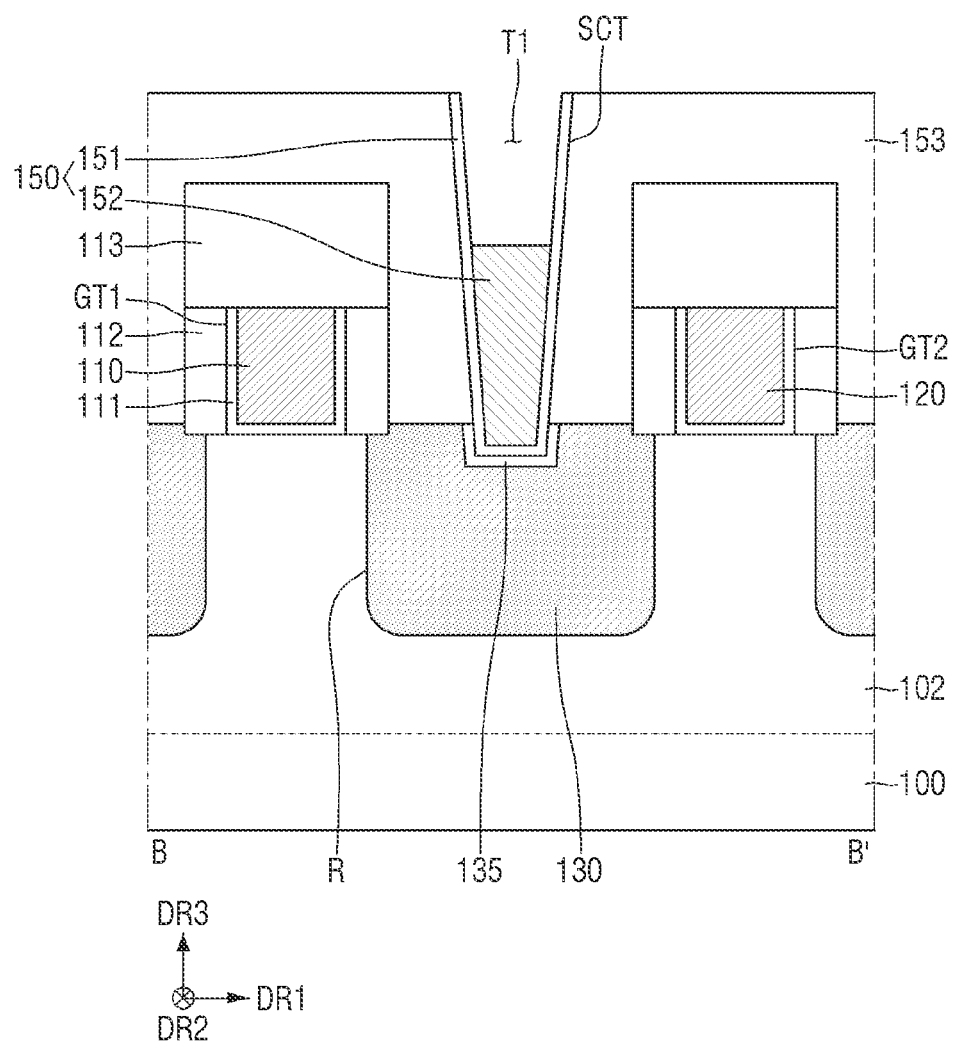

Referring to FIG. 13, a first trench T1 may be formed by removing a part (e.g., an upper portion) of the preliminary second contact filling layer 152p, using the etching compositions according to some embodiments of the present disclosure. As a result, the second contact filling layer 152 may be formed inside the second contact trench SCT. The first trench T1 may be defined by the upper surface of the second contact filling layer 152 and the second contact barrier layer 151.

Figure 14:
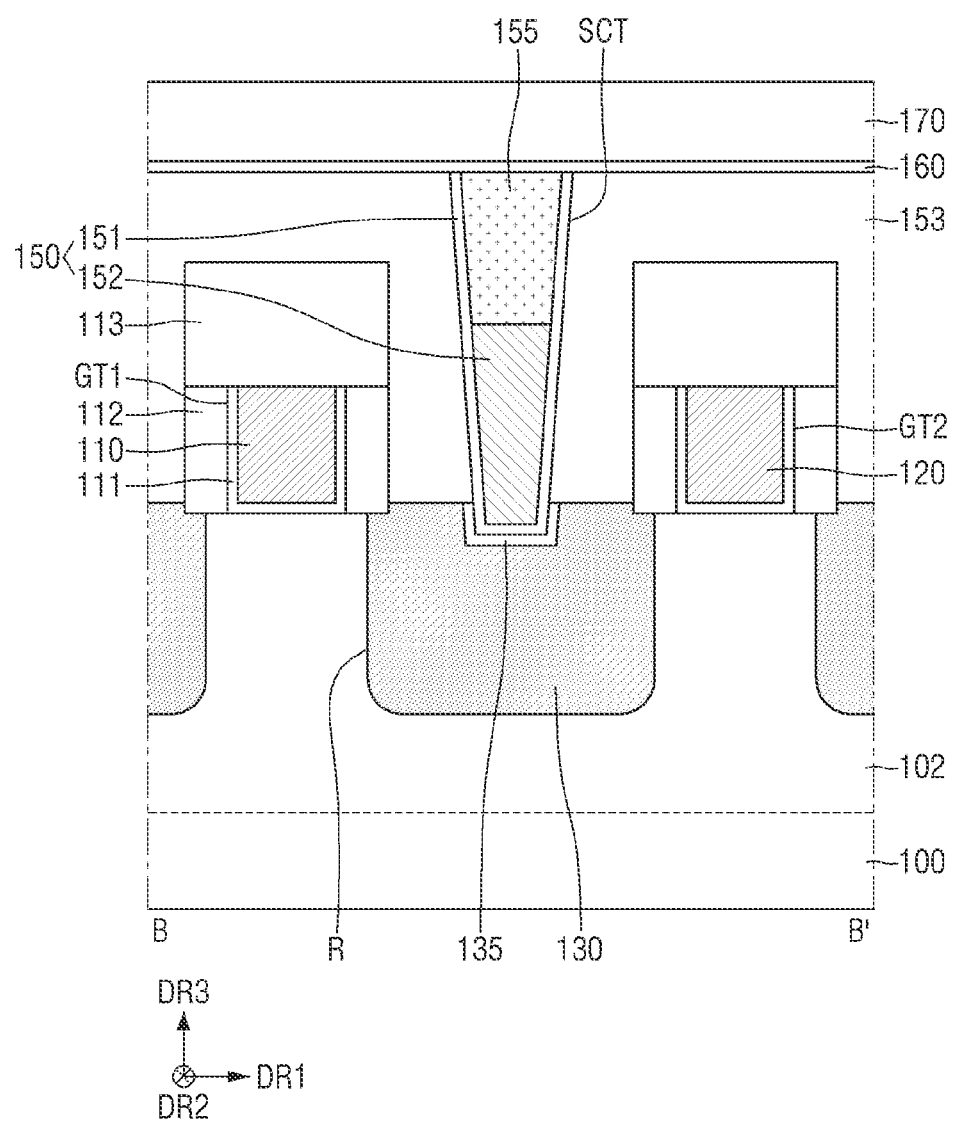

Referring to FIG. 14, a second interlayer insulating layer 155 may be formed inside the first trench T1. Subsequently, the etching stop film 160 and the third interlayer insulating layer 170 may be sequentially formed on the first interlayer insulating layer 153 and the second interlayer insulating layer 155.

Referring back to FIG. 3, a second via 190 may be formed to penetrate the third interlayer insulating layer 170, the etching stop film 160 and the second interlayer insulating layer 155 in the vertical direction DR3. The second via 190 may be connected to the second contact filling layer 152. Through fabricating methods described herein, the semiconductor device shown in FIG. 3 may be fabricated.

Hereinafter, a method for fabricating a semiconductor device using the etching compositions according to some other embodiments of the present disclosure will be described referring to FIGS. 15 to 17. Differences from the methods for fabricating the semiconductor device using the etching compositions described with reference to FIGS. 5 to 14 will be mainly described.

Figure 15:
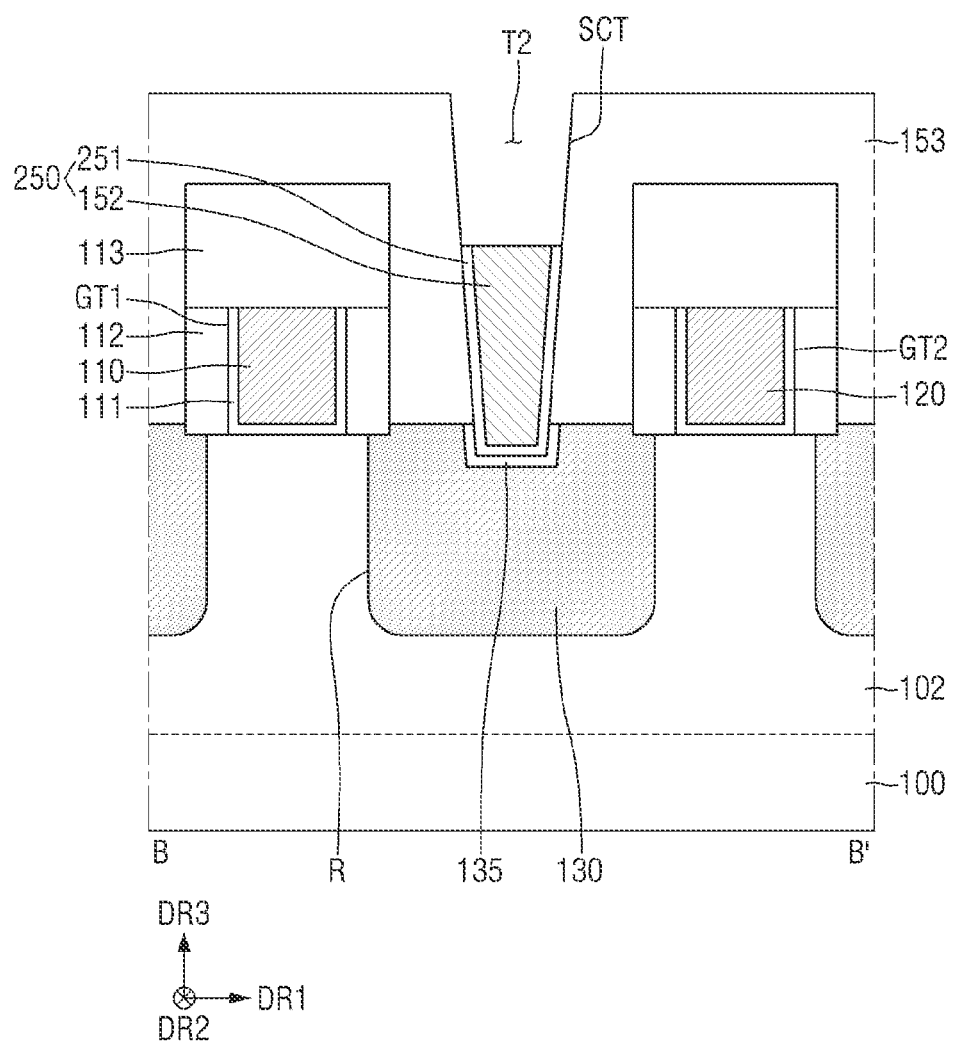
FIGS. 15 to 17 are intermediate stage diagrams for explaining a method for fabricating a semiconductor device using etching compositions according to some other embodiments of the present disclosure.
Figure 16:
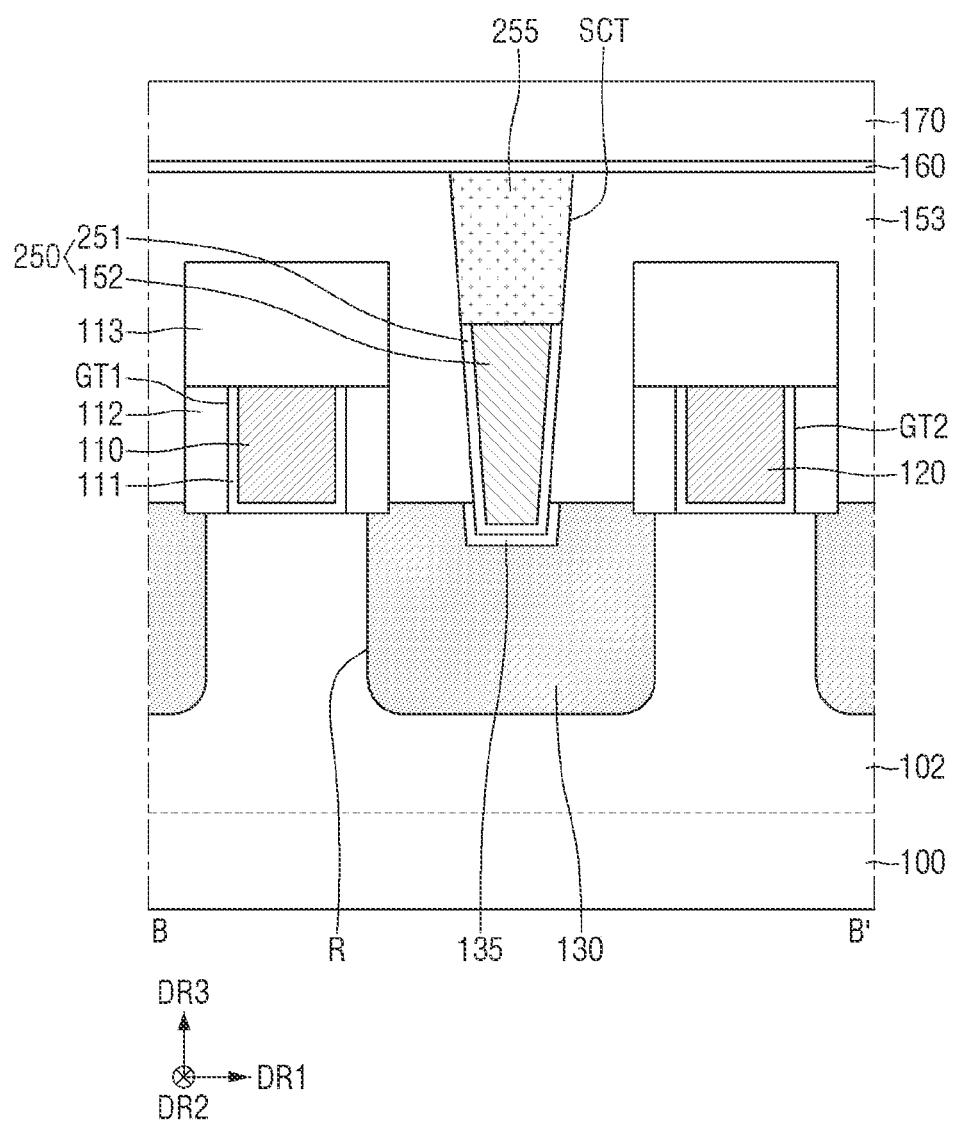
Figure 17:
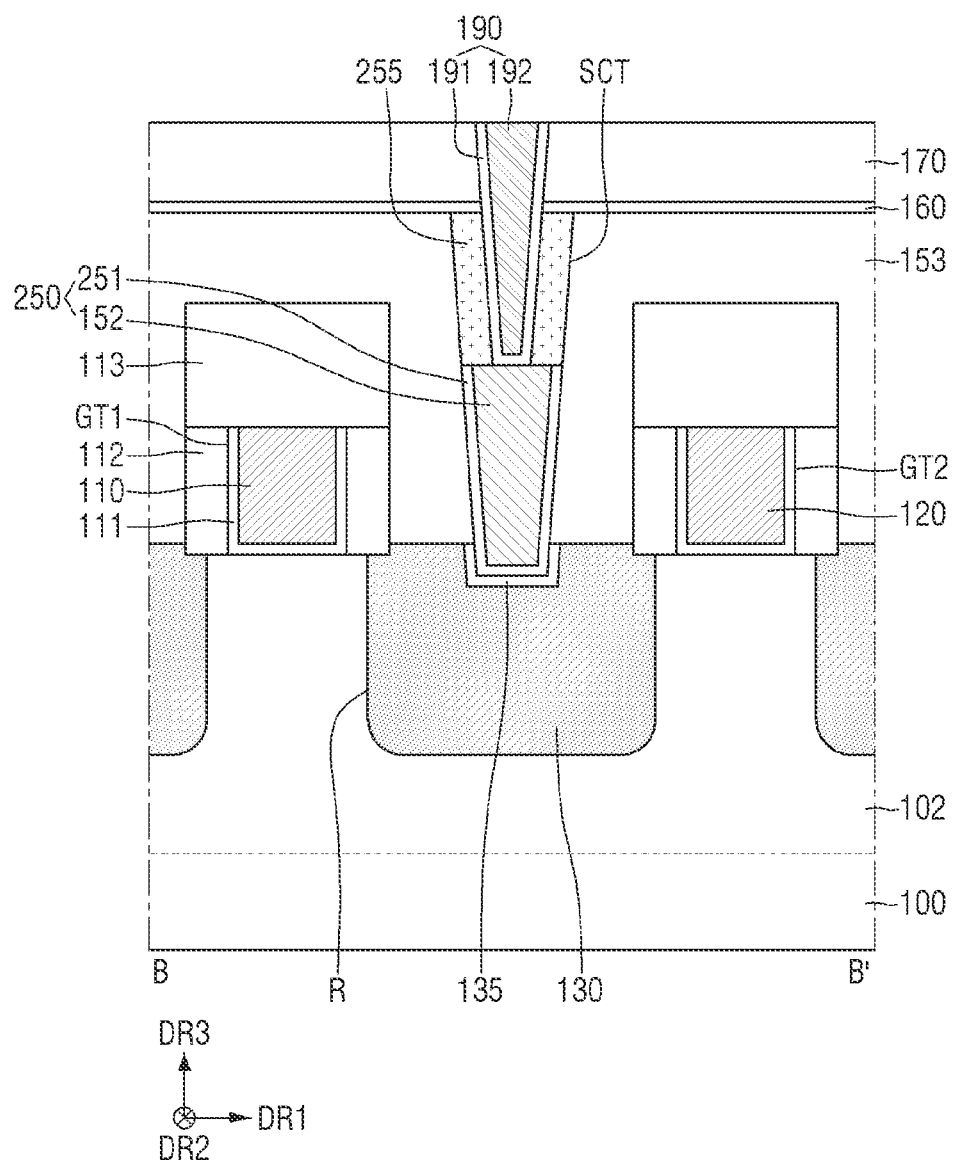

FIGS. 15 to 17 are intermediate stage diagrams for explaining a method for fabricating a semiconductor device using etching compositions according to some other embodiments of the present disclosure.

Referring to FIG. 15, after performing the fabricating processes shown in FIGS. 5 to 13, a part (e.g., an upper portion) of the second contact barrier layer (151 of FIG. 13) exposed to the first trench (T1 of FIG. 13) may be removed to form a second trench T2. The second trench T2 may be defined by the upper surface of the second contact barrier layer 251, the upper surface of the second contact filling layer 152, and the side walls of the second contact trench SCT.

Referring to FIG. 16, a second interlayer insulating layer 255 may be formed to fill the second trench T2 on the source/drain contact 250. Subsequently, the etching stop film 160 and the third interlayer insulating layer 170 may be sequentially formed on the first interlayer insulating layer 153 and the second interlayer insulating layer 255.

Referring to FIG. 17, a second via 190 may be formed to penetrate the third interlayer insulating layer 170, the etching stop film 160 and the second interlayer insulating layer 255 in the vertical direction DR3. The second via 190 may be connected to the second contact filling layer 152.

Hereinafter, a method for fabricating a semiconductor device using etching compositions according to some other embodiments of the present disclosure will be described referring to FIGS. 18 to 23. Differences from the methods for fabricating the semiconductor device using the etching compositions described with reference to FIGS. 5 to 14 will be mainly described.

Figure 18:
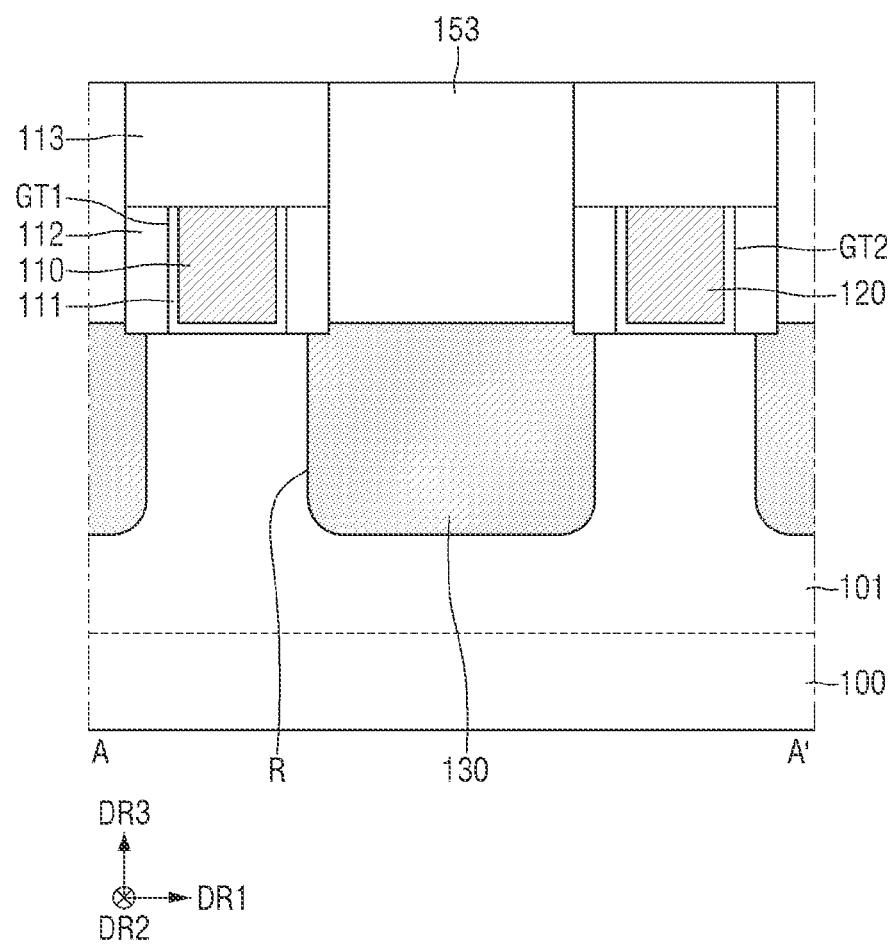
FIGS. 18 to 23 are intermediate stage diagrams for explaining a method for fabricating a semiconductor device using etching compositions according to some other embodiments of the present disclosure.

Referring to FIG. 18, a first gate structure including the gate insulating film 111, the gate spacer 112, the first gate electrode 110 and the capping pattern 113 may be formed on the first active pattern 101, by performing the fabricating processes shown in FIGS. 5 to 10. Further, a second gate structure including the gate insulating film 111, the gate spacer 112, the second gate electrode 120 and the capping pattern 113 may be formed on the first active pattern 101.

Figure 19:
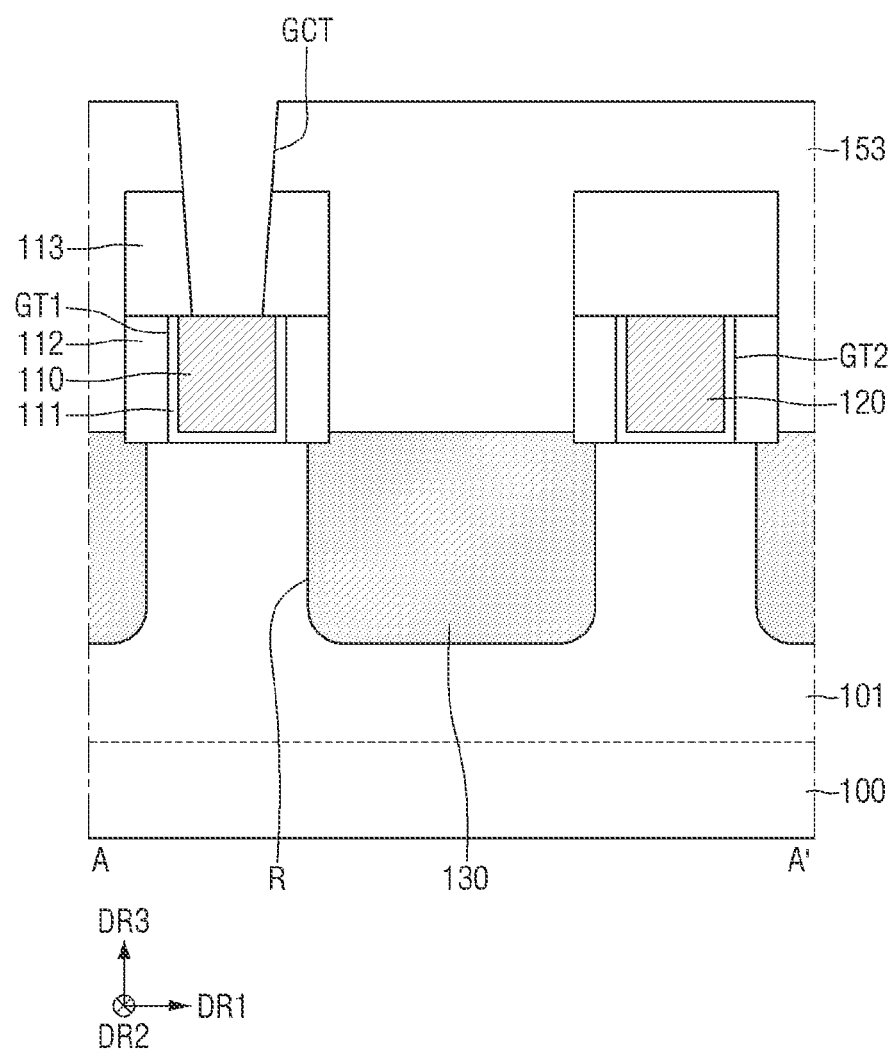

Referring to FIG. 19, the first interlayer insulating layer 153 may be additionally formed on the capping pattern 113 and the first interlayer insulating layer 153. However, the present disclosure is not limited thereto. In some other embodiments, additional formation of the first interlayer insulating layer 153 may be omitted.

Subsequently, a first contact trench GCT may be formed on the first gate electrode 110 to penetrate the first interlayer insulating layer 153 and the capping pattern 113 in the vertical direction DR3. The first contact trench GCT may be formed on the first active pattern 101. The first gate electrode 110 may be exposed by the first contact trench GCT.

Figure 20:
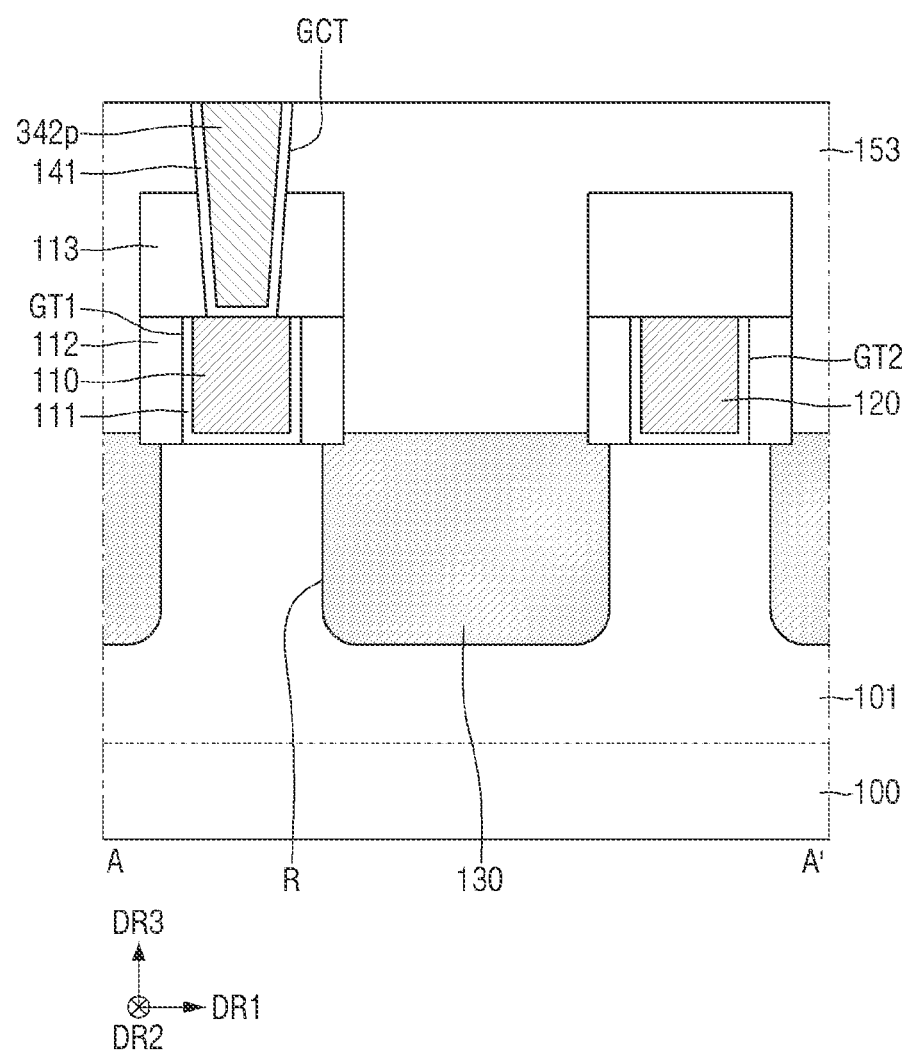

Referring to FIG. 20, a first contact barrier layer 141 may be formed inside the first contact trench GCT. The first contact barrier layer 141 may be formed along the side walls and bottom surface of the first contact trench GCT.

Subsequently, a preliminary first contact filling layer 342p may be formed on the first contact barrier layer 141 to fill the inside of the first contact trench GCT. The preliminary first contact filling layer 342p may include, for example, cobalt (Co).

Figure 21:
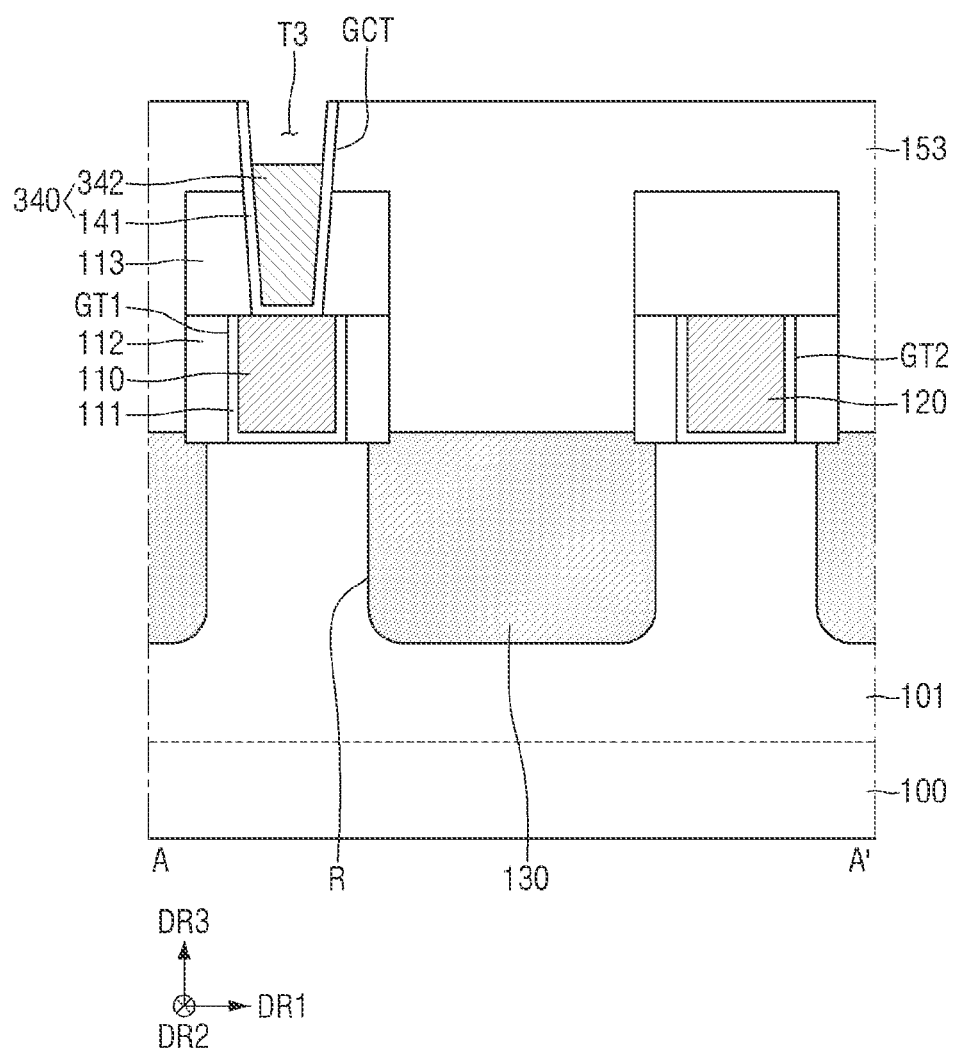

Referring to FIG. 21, a third trench T3 may be formed by removing a part (e.g., an upper portion) of the preliminary first contact filling layer 342p, using the etching compositions according to some embodiments of the present disclosure. As a result, the first contact filling layer 342 may be formed inside the first contact trench GCT. The third trench T3 may be defined by the upper surface of the first contact filling layer 342 and the first contact barrier layer 141.

Figure 22:
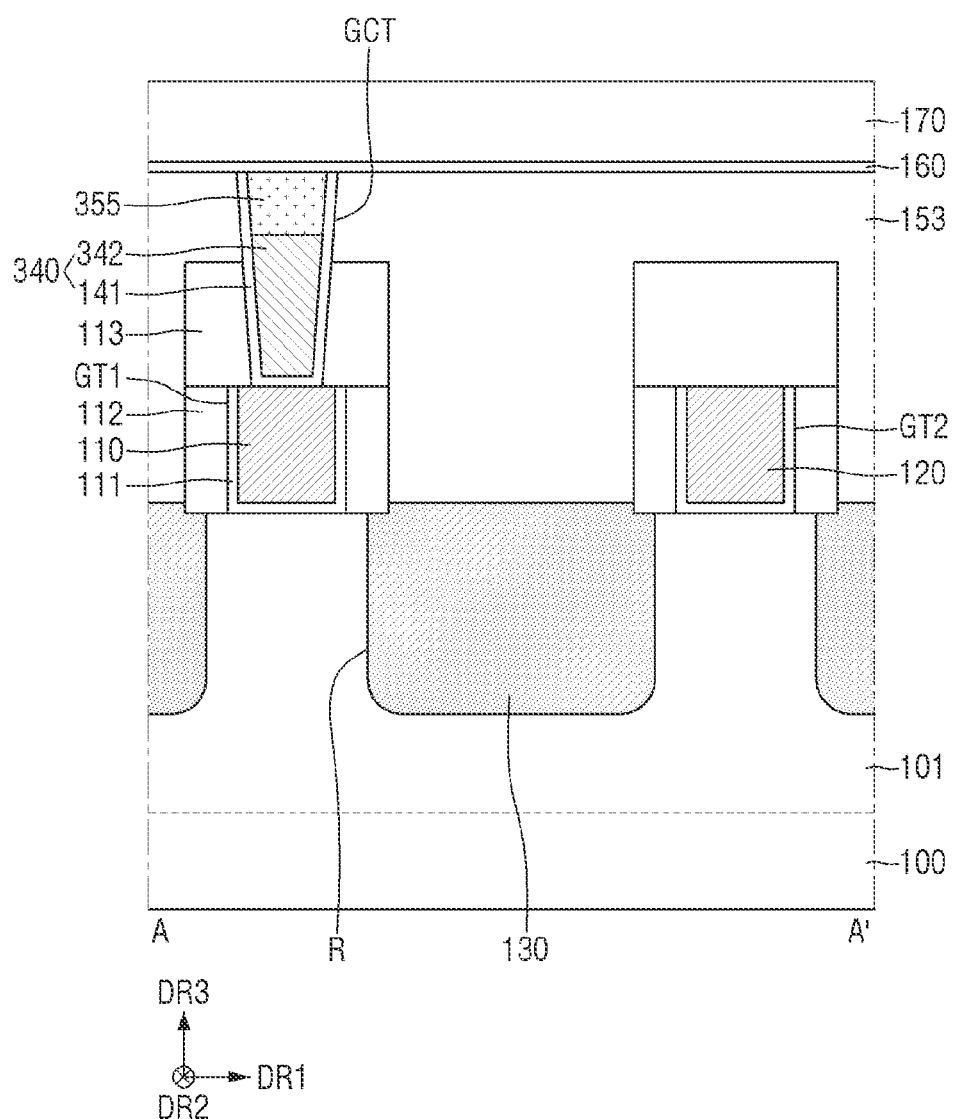

Referring to FIG. 22, a second interlayer insulating layer 355 may be formed inside the third trench T3. Subsequently, the etching stop film 160 and the third interlayer insulating layer 170 may be sequentially formed on the first interlayer insulating layer 153 and the second interlayer insulating layer 355.

Figure 23:
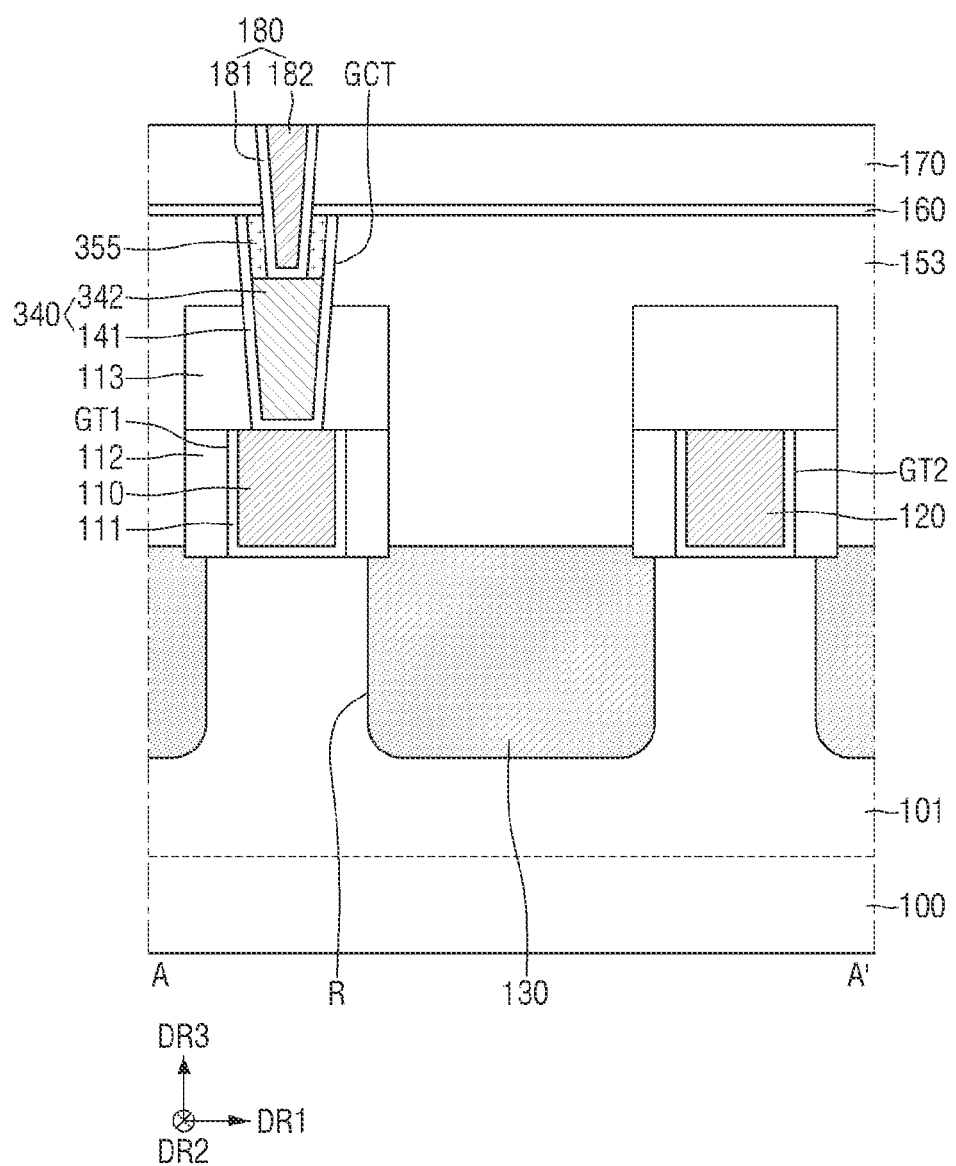

Referring to FIG. 23, the first via 180 may be formed to penetrate the third interlayer insulating layer 170, the etching stop film 160 and the second interlayer insulating layer 355 in the vertical direction DR3. The first via 180 may be connected to the gate contact 340. That is, the first via 180 may be connected to the first contact filling layer 342.

Hereinafter, a method for fabricating a semiconductor device using the etching compositions according to some other embodiments of the present disclosure will be described referring to FIGS. 24 to 26. Differences from the methods for fabricating the semiconductor device using the etching compositions described with reference to FIGS. 5 to 14 will be mainly described.

Figure 24:
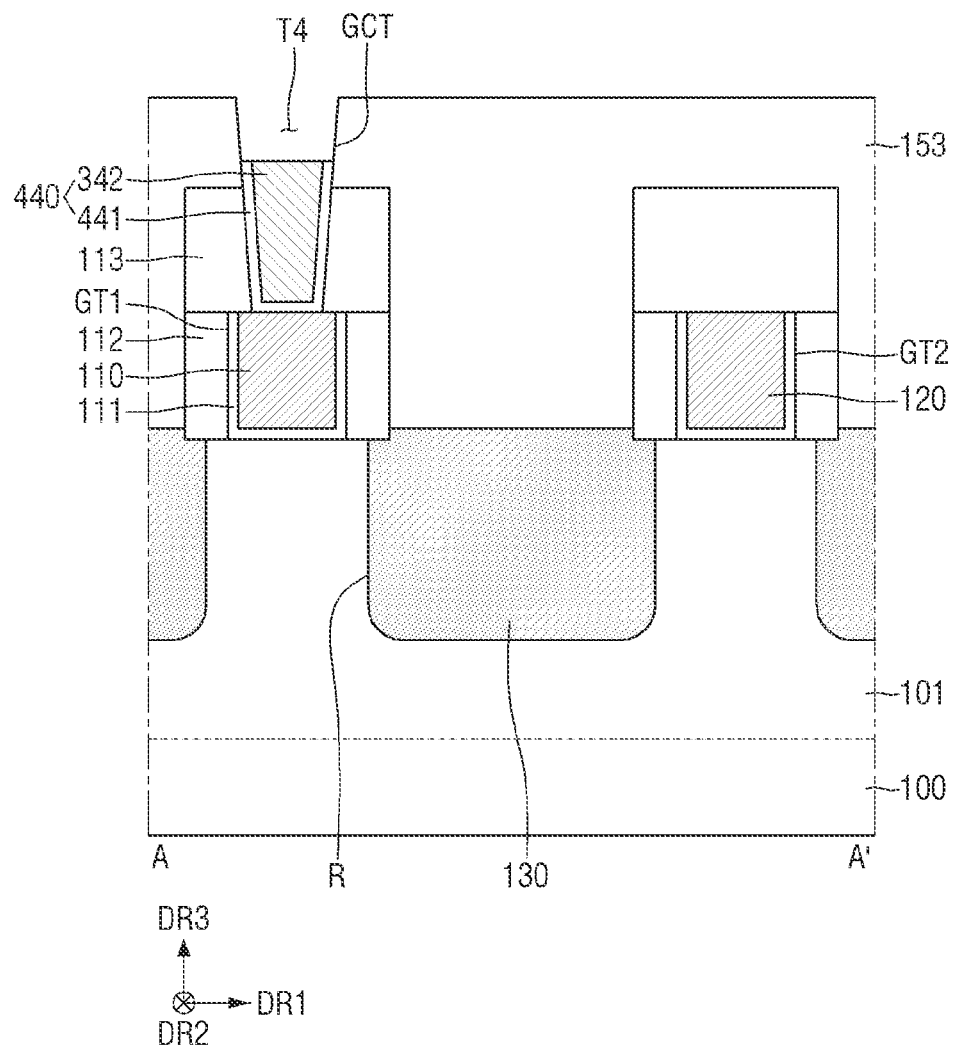
FIGS. 24 to 26 are intermediate stage diagrams for explaining a method for fabricating a semiconductor device using etching compositions according to some other embodiments of the present disclosure.
Figure 25:
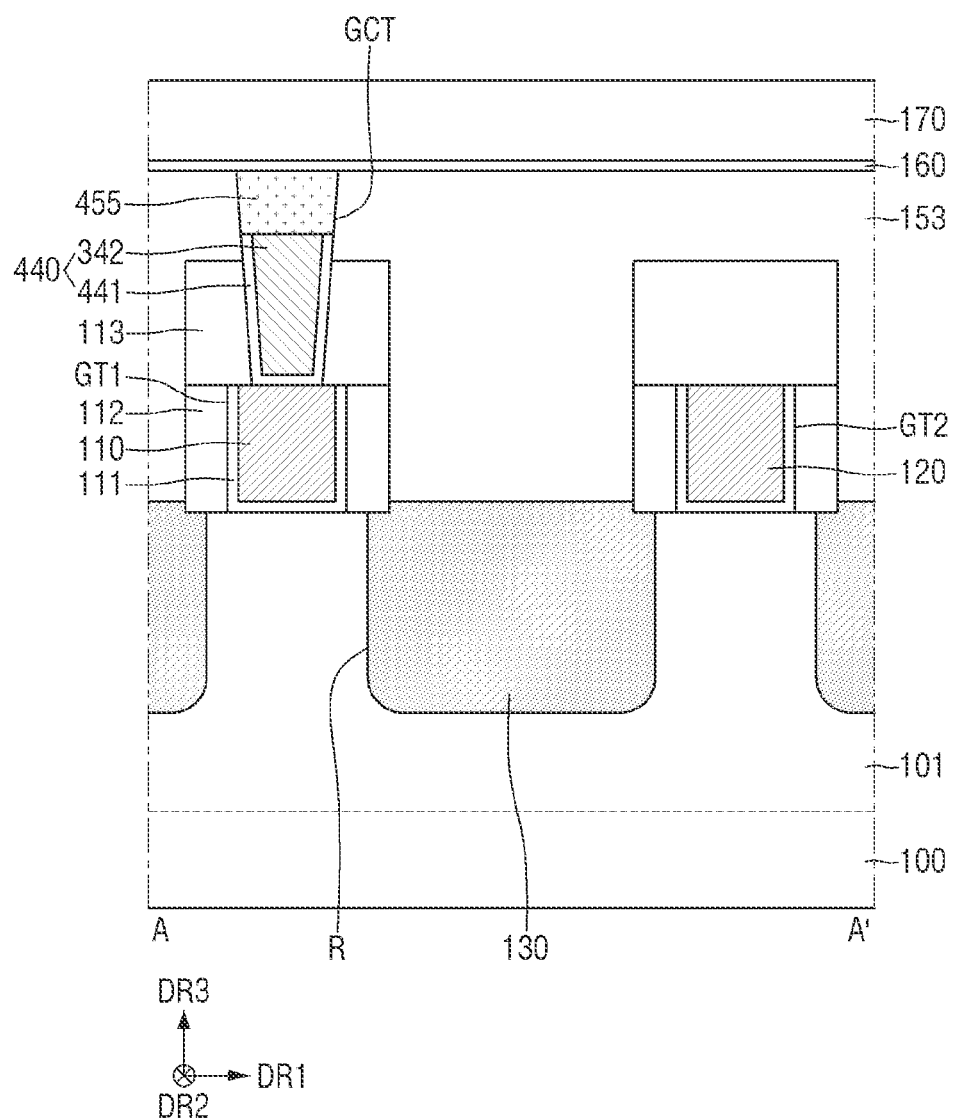
Figure 26:
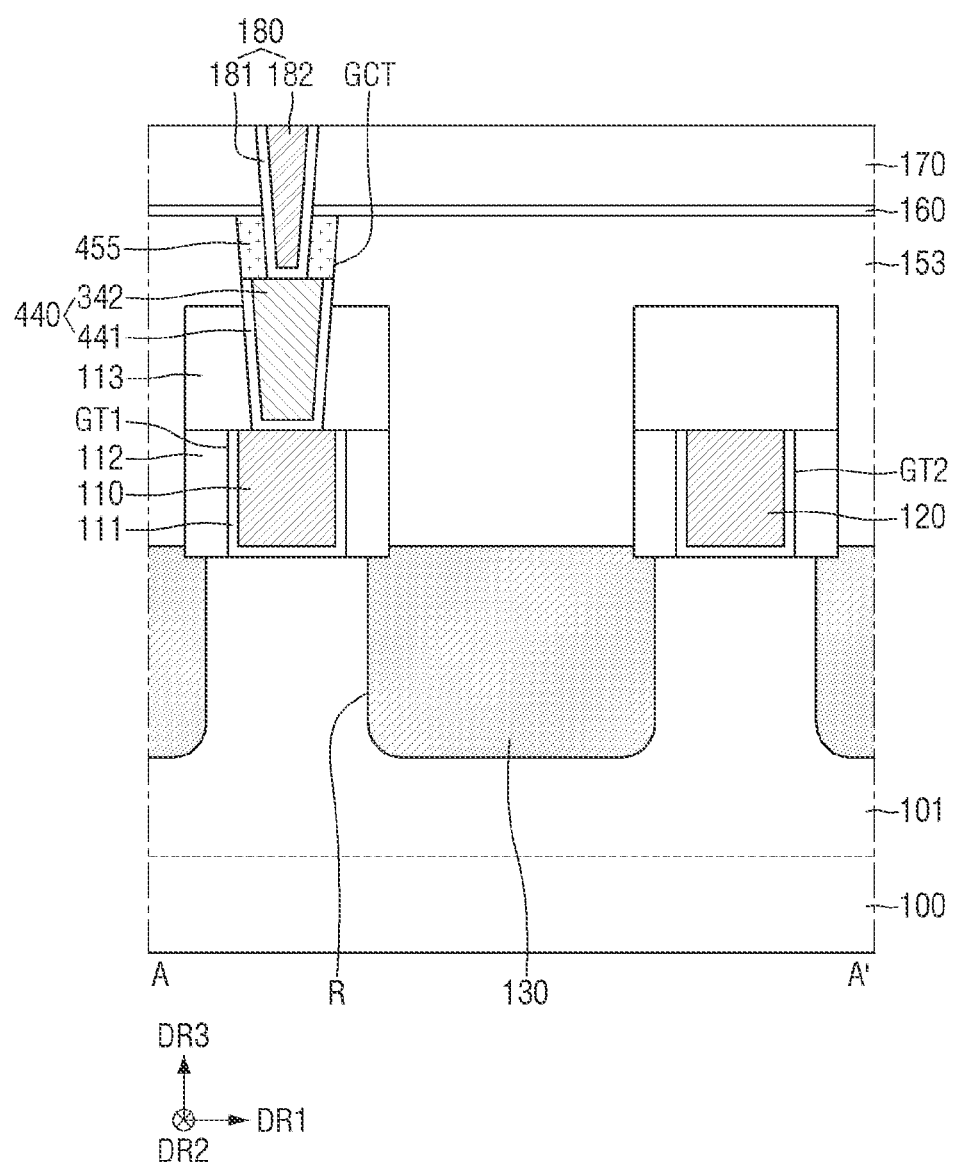

FIGS. 24 to 26 are intermediate stage diagrams for explaining a method for fabricating a semiconductor device using etching compositions according to some other embodiments of the present disclosure.

Referring to FIG. 24, a fourth trench T4 may be formed, by removing a part (e.g., an upper portion) of the first contact barrier layer (141 of FIG. 21) exposed to the third trench (T3 of FIG. 21) after performing the fabricating processes shown in FIGS. 5 to 9 and 18 to 21. The fourth trench T4 may be defined by the upper surface of the first contact barrier layer 441, the upper surface of the first contact filling layer 342, and the side walls of the first contact trench GCT.

Referring to FIG. 25, a second interlayer insulating layer 455 on the first gate electrode 110 may be formed to fill the fourth trench T4. Subsequently, the etching stop film 160 and the third interlayer insulating layer 170 may be sequentially formed on the first interlayer insulating layer 153 and the second interlayer insulating layer 455.

Referring to FIG. 26, the first via 180 may be formed to penetrate the third interlayer insulating layer 170, the etching stop film 160 and the second interlayer insulating layer 455 in the vertical direction DR3. The first via 180 may be connected to the gate contact 440. That is, the first via 180 may be connected to the first contact filling layer 342.

In concluding the detailed description, those skilled in the art will appreciate that many variations and modifications may be made to the example embodiments described herein without substantially departing from the principles of the present disclosure. Therefore, the disclosed embodiments of the disclosure are used in a generic and descriptive sense only and not for purposes of limitation.

What is claimed is:

1. An etching composition for etching cobalt, the etching composition comprising:
   a chelator in an amount of 1 wt % to 23 wt % based on the total weight of the etching composition;
   water;
   an oxidizer; and
   an organic solvent, wherein the chelator includes an organic acid, an amine compound, and/or a polyhydric alcohol, wherein the water is present in an amount of 1 wt % to 10 wt % based on a total weight of the etching composition, wherein the etching composition is devoid of a fluorine compound, wherein the chelator is configured to bind to cobalt to form a compound having a pentagonal ring structure or a hexagonal ring structure, represented by Formula 1 or Formula 2:

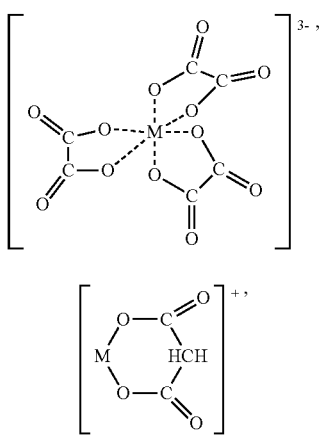

and wherein in Formula 1 and Formula 2, M is cobalt.

2. The etching composition of claim 1, wherein the chelator includes the organic acid, and the organic acid includes methanesulfonic acid, ethanesulfonic acid, benzenesulfonic acid, p-toluenesulfonic acid, sulfobenzoic acid, sulfosuccinic acid, sulfophthalic acid, sulfosalicylic acid, acetic acid, butanoic acid, citric acid, formic acid, caprylic acid, imminodiacetic acid, propenoic acid, isocitric acid, tartaric acid, glycolic acid, malonic acid, oxalic acid, pentanoic acid, phthalic acid, salicylic acid, benzoic acid, lactic acid, propionic acid, glutaric acid, fumaric acid, adipic acid, glutamic acid, glyceric acid, succinic acid, malic acid, maleic acid, glycine, ethylenediaminetetraacetic acid, and/or nitrilotriacetic acid.

3. The etching composition of claim 1, wherein the chelator includes the amine compound, and the amine compound includes an alkyl group, a cycloalkyl group or an aryl group bound to an amine, and the amine compound includes at least one primary amine at one end of the amine compound.

4. The etching composition of claim 1, wherein the chelator includes the polyhydric alcohol, and the polyhydric alcohol includes diol, ethylene glycol, propylene glycol, glycerine and/or nitrilotriethanol.

5. The etching composition of claim 1, wherein the oxidizer further comprises hydrogen peroxide.

6. The etching composition of claim 1, wherein the organic solvent includes dimethyl sulfoxide, dimethylsulfone, diethylsulfone, methylsulfolane, sulfolane, γ-butyro lactone, delta-valerolactone, diethyl ketone, ethyleneglycol, diethyl acetamide, triethylphosphate, monomethyl ether acetate, and/or 1,3-dimethyl-2-imidazolinone.

7. The etching composition of claim 1, wherein the etching composition has a pH of 4 to 9.

8. The etching composition of claim 1, wherein the oxidizer is present in an amount of 0.7 wt % to 10 wt % based on the total weight of the etching composition.

9. The etching composition of claim 1, wherein etching composition comprises the organic solvent in an amount of 50 wt % to 80 wt % based on the total weight of the etching composition.

* * * * *